United States Patent
Greenstreet

(10) Patent No.: US 7,073,086 B2
(45) Date of Patent: Jul. 4, 2006

(54) SYSTEM FOR CONTROLLING A TUNABLE DELAY BY TRANSFERRING A SIGNAL FROM A FIRST PLURALITY OF POINTS ALONG A FIRST PROPAGATING CIRCUIT TO A SECOND PLURALITY OF POINTS ALONG A SECOND PROPAGATING CIRCUIT

(75) Inventor: Mark R. Greenstreet, Vancouver (CA)

(73) Assignee: Sun Microsystems, Inc., Santa Clara, CA (US)

( * ) Notice: Subject to any disclaimer, the term of this patent is extended or adjusted under 35 U.S.C. 154(b) by 429 days.

(21) Appl. No.: 10/306,721

(22) Filed: Nov. 27, 2002

(65) Prior Publication Data
US 2003/0177409 A1    Sep. 18, 2003

Related U.S. Application Data

(60) Provisional application No. 60/333,711, filed on Nov. 27, 2001.

(51) Int. Cl.
*H04L 5/00* (2006.01)

(52) U.S. Cl. ...................................................... 713/401
(58) Field of Classification Search ................. 713/401
See application file for complete search history.

(56) References Cited

U.S. PATENT DOCUMENTS

| | | | | |
|---|---|---|---|---|
| 5,036,489 A | * | 7/1991 | Theobald | 365/73 |
| 6,020,939 A | * | 2/2000 | Rindal et al. | 348/805 |
| 6,222,407 B1 | * | 4/2001 | Gregor | 327/269 |
| 6,453,402 B1 | * | 9/2002 | Jeddeloh | 711/167 |

* cited by examiner

*Primary Examiner*—Chun Cao
*Assistant Examiner*—Mark Connolly
(74) *Attorney, Agent, or Firm*—Townsend and Townsend and Crew LLP

(57) ABSTRACT

The clock signal is the dominant source of electromagnetic interference (EMI) for many electronic devices. EMI generated by an electronic device must be suppressed to avoid interference with other electronic devices and to satisfy FCC regulations. EMI emissions are reduced by phase-modulating the clock signal using tunable delay lines. Phase modulation causes a spreading of the energy spectrum of the clock signal thereby reducing EMI emissions. Implementations of the tunable delay lines are provided. In one implementation, a tunable delay line includes a first pipeline, a second pipeline, and a coupling mechanism for coupling the first pipeline to the second pipeline at various transfer points. The forward latency of the second pipeline is longer than that of the first pipeline. Based on external control signals, a clock pulse traveling along the first pipeline can be transferred via the coupling mechanism to the second pipeline thereby allowing the clock pulse to continue to propagate along the second pipeline.

24 Claims, 15 Drawing Sheets

Top Level Delay Line Design

Top Level Delay Line Design

The Slow Pipeline

Revised Delay Line Design

SYSTEM FOR CONTROLLING A TUNABLE DELAY BY TRANSFERRING A SIGNAL FROM A FIRST PLURALITY OF POINTS ALONG A FIRST PROPAGATING CIRCUIT TO A SECOND PLURALITY OF POINTS ALONG A SECOND PROPAGATING CIRCUIT

CROSS REFERENCES TO RELATED APPLICATION

The present application claims the benefit of priority under 35 U.S.C. § 119 from U.S. Provisional Patent Application Ser. No. 60/333,711, entitled "A SELF-TIMED PIPELINE FOR TUNABLE DELAYS" filed on Nov. 27, 2001, the disclosure of which is hereby incorporated by reference in its entirety for all purposes.

BACKGROUND OF THE INVENTION

The present invention generally relates to the implementation of tunable delay lines. More specifically, the present invention relates to the implementation of tunable delay lines which can be used to reduce electromagnetic interference generated by the clock and other signals inside electronic devices such as computers and cellular telephones.

The electromagnetic interference (EMI) generated by an electronic device must be suppressed to avoid interference with other electronic devices and to satisfy FCC regulations. For example, a number of computer workstations or servers contain conductive components in their cases or housings to create Faraday cages to limit the emissions of EMI. The incorporation of such components to provide shielding of EMI adds to the cost of manufacturing the workstations and servers.

The clock signal is the dominant source of EMI for many electronic devices. In addition, since the currents flowing through the power and data paths for an integrated circuit tend to be temporally correlated with the clock signal, other signals which bear a relationship with the clock signal can also be a source of EMI within an electronic device.

Most of the energy causing EMI is radiated via the power supply signals on the circuit board and in the IC package. Because the clock signal is generally periodic, much of this radiation is concentrated at the clock frequency and its harmonics. In other words, when the energy spectrum of the clock signal is shown graphically, there are distinctive peaks associated with certain frequencies.

One way to mitigate the effects of this radiation is to modulate the clock signal so that the energy is spread over a wider range of frequencies. This can reduce the severity of the interference caused by the electronic device as most radio communications devices operate with relatively narrow band signals. As a result, FCC regulations for EMI specify a maximum intensity in any small band of the spectrum.

Since the clock signal is an important component of any computer, the opportunity to utilize spread spectrum clock generators has been exploited in some PC designs. Frequency modulation has been used to provide a spread energy spectrum. For example, NeoMagic Corporation sells a reference clock generator where the reference oscillator is frequency modulated by a triangular wave with a frequency near 50 MHz (see Dual-Loop Spread-Spectrum Clock Generator, Proceedings of the 1999 IEEE International Solid-State Circuits Conference, pp. 184–185, 459, February, 1999). Intel has committed to support this approach which means that it is guaranteed that Intel's on-chip phase-locked loops will operate properly when driven by such a frequency modulated source.

FIG. 1 shows a typical clock generator for a CPU. A reference oscillator 10 generates a stable clock signal which is multiplied in frequency by a phase-locked loop 12 on the CPU chip 14 to obtain the CPU clock. Typically, the frequency multiplication is in the range of two to six. The high frequency signal from the phase-locked loop 12 is then amplified by a clock buffer 16 and accordingly distributed to the logic circuitry 18 outside of the CPU 14.

However, the primary objectives of phase-locked loop (PLL) design are in opposition to the goals of frequency modulations. In particular, the on-chip PLL is generally designed to be as stable as possible to minimize clock jitter. Thus, it is desirable to use a low-pass filter in the PLL with the lowest cut-off frequency possible. On the other hand, for the frequency modulation technique to be effective, the cut-off frequency of the low-pass filter must be higher than the modulation frequency. In addition to compromising clock jitter, this trade-off limits the modulation frequency for the reference. When low modulation frequencies are used, the computer may still produce noxious EMI even if it technically satisfies the FCC requirements. For this reason, some computer manufacturers have expressed reluctance to utilize the frequency modulation technique to achieve a wide energy spectrum clock.

Using frequency modulation to generate a wider energy spectrum for a clock signal has a number of additional disadvantages. For example, frequency modulation affects the operation of the PLL 12. Hence, the stability of the PLL 12 is affected. Moreover, the energy spreading resulted from using frequency modulation generally takes relatively longer periods of time to achieve. In the related U.S. patent application Ser. No. (to be assigned), entitled EMI REDUCTION USING TUNABLE DELAY LINES, concurrently filed and commonly assigned, an apparatus and method using tunable delay lines to reduce electromagnetic interference generated by signals inside electronic devices is described. The present invention described herein provides further details regarding the implementation of tunable delay lines to permit electromagnetic interference reduction. In addition to the foregoing, it is commonly known that there are various other applications of tunable delay lines.

SUMMARY OF THE INVENTION

In a first exemplary embodiment, a tunable delay line according to the present invention includes a first pipeline, a second pipeline, and a coupling mechanism for coupling the first pipeline to the second pipeline at various transfer points. The forward latency of the second pipeline is longer than that of the first pipeline. Based on external control signals, a clock pulse traveling along the first pipeline can be transferred via the coupling mechanism to the second pipeline thereby allowing the clock pulse to continue to propagate along the second pipeline.

In another exemplary embodiment, both the first and second pipelines further respectively include a number of stages which are sequentially coupled to one another. The coupling mechanism also includes a number of stages. One stage of the first pipeline is coupled to a corresponding stage of the second pipeline via a stage of the coupling mechanism.

In an exemplary embodiment, the tunable delay line according to the present invention is implemented using the asynchronous symmetric persistent pulse protocol, asP*.

Additional information on asP* can be found in, for example, "A FIFO Ring Performance Experiment" by Molnar et al., Proc. Int'l Symposium on Advanced Research in Asynchronous Circuits and Systems, IEEE Computer Society Press, pp. 279–289, April 1997.

The present invention can be used in a number of applications. For example, the present invention provides a tunable delay line which can be used to reduce electromagnetic interference generated by signals inside electronic devices. In addition, the present invention can also be used in various other applications. For example, in a clocked system, delay lines with fine resolution can be used to generate clock phases that allow data to be latched at an optimal time. In another example, precise delay lines are useful in test instruments for generating signals with precisely known timing properties, or for measuring timing relationships between signals. A person skilled in the art can identify other applications of the present invention.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings. In the drawings, like reference numbers indicate identical or functionally similar elements.

DETAILED DESCRIPTION OF THE INVENTION

Figure 1:
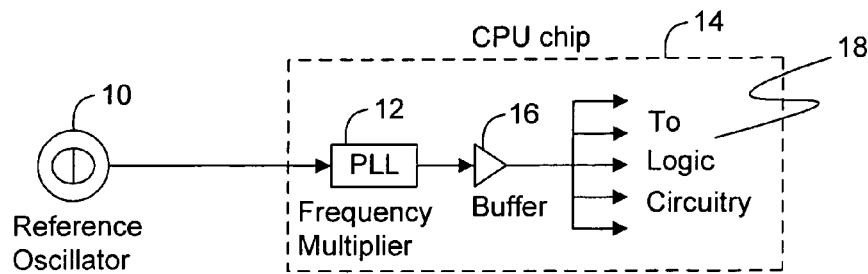
FIG. 1 is a simplified schematic block diagram showing a typical clock signal generator.
Figure 2:
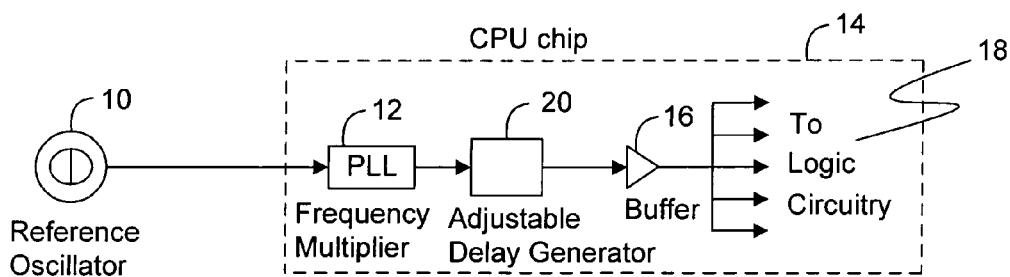
FIG. 2 is a simplified schematic diagram showing one illustrative configuration incorporating one exemplary embodiment of the present invention.

The present invention in the form of various embodiments will now be described. FIG. 2 is a simplified schematic diagram showing one illustrative configuration incorporating one exemplary embodiment of the present invention. An adjustable delay generator 20 is coupled between a signal source such as a phase-locked loop (PLL) 12 and a clock buffer 16.

Figure 3:
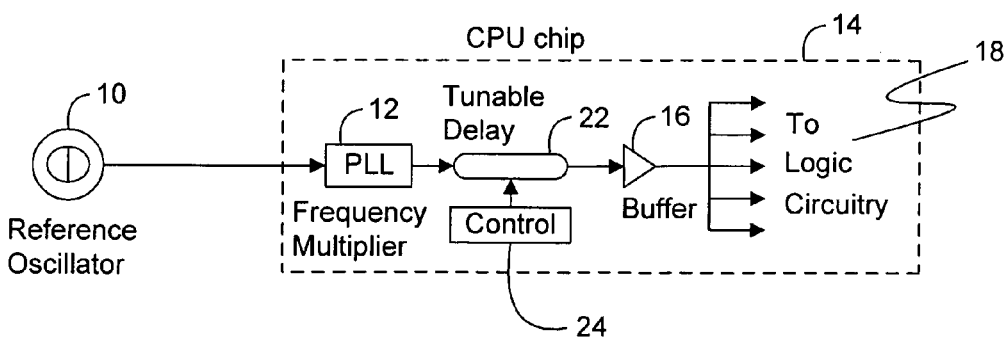
FIG. 3 is a simplified schematic diagram showing a more detailed illustrative configuration incorporating one exemplary embodiment of the present invention.

FIG. 3 is a simplified schematic diagram showing a more detailed illustrative configuration incorporating one exemplary embodiment of the present invention. The adjustable delay generator 20 further includes a tunable delay line 22 and a delay controller 24.

Figure 4:
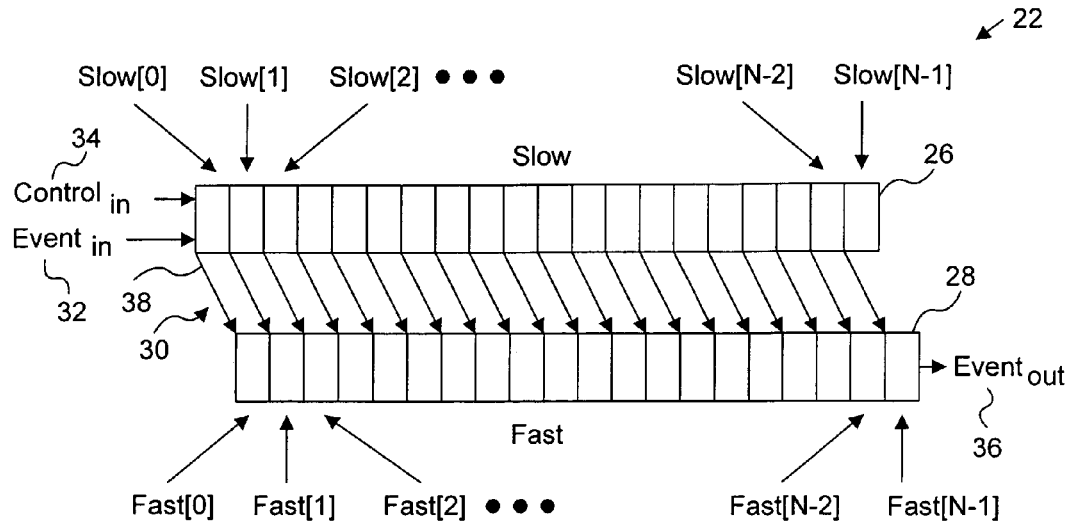
FIG. 4 is a simplified schematic diagram showing one exemplary embodiment of a tunable delay line in accordance with the present invention.

FIG. 4 shows one embodiment of the tunable delay line 22 in accordance with the present invention. The tunable delay line 22 includes two self-timed pipelines 26, 28 with adjustable forward latency or delay. The upper pipeline is referred to as the slow pipeline 26, and the lower pipeline is referred to as the fast pipeline 28. The slow pipeline 26 is coupled to the fast pipeline 28 at various transfer points 30. The coupling mechanism which is used to implement the various transfer points 30 will be described further below.

Having the ability to provide an adjustable forward latency allows a signal propagating along a pipeline to be delayed. The forward latency of the slow pipeline 26 is P time units longer than that of the fast pipeline 28. P may correspond, for example, to a clock period. An embodiment of the present invention which implements the foregoing forward latency will be more fully described below.

The two pipelines 26, 28 operate in the following manner. Both the slow pipeline 26 and the fast pipeline 28 operate on a first-in-first-out (FIFO) basis. A signal source, for example a phase-locked loop, injects one event, typically in the form of a clock pulse $\Phi_{in}$, into the event_in input 32 of the slow pipeline 26 each clock period pursuant to command signals, such as control_in 34, issued by delay controller 24. The pulse event_in 32 initially propagates along the slow pipeline 26. Based on the control_in signal 34, the slow pipeline 26 then transfers the pulse event_in 32 to the fast pipeline 28 at the appropriate one of the coupling points 30. The pulse event_in 32 subsequently continues to propagate along the fast pipeline 28 until it is output as event_out 36. Since the slow pipeline 26 has a longer forward latency than the fast pipeline 28, the pulse event_out 36 exiting the fast pipeline 28 in effect is a delayed version of the pulse event_in 32, with the delay depending on the coupling point 30 of the stage at which the pulse was transferred to the fast pipeline 28. A person skilled in the art will recognize that the slow and fast pipelines 26, 28 could be interchanged so that events can enter the fast pipeline 28 and then be transferred to the slow pipeline 26.

In an exemplary embodiment, the slow pipeline 26 and the fast pipeline 28 further respectively include a number of sequentially coupled stages, such that each stage of the fast pipeline 28 has the same latency and each stage of the slow pipeline 26 has the same latency, with the latency of a slow pipeline stage being longer than the latency of a fast pipeline stage. Further details describing these stages will be provided below.

Now consider, for example, the case where both the slow and fast pipelines 26, 28 have 100 stages. Let P be the total difference in latency between the fast and slow pipelines 26, 28. Each stage of the slow pipeline 26 has a forward latency that is P/100 greater than the delay of a fast pipeline stage. Let $\tau_0$ be the latency of the tunable delay line 22 if the transfer of a pulse occurs at the first transfer point 38. If the transfer point is moved one stage to the right, the latency increases to $\tau_0+P/100$. Likewise, if the transfer point is moved k stages to the right, the latency increases to $\tau_0+k*(P/100)$.

Hence, for the configuration depicted in FIG. 4, an N stage pipeline has N−1 transfer points. Thus, the delay ranges from $\tau_0$ to $\tau_0+P*(N-1)/N$. It is evident that the cyclic nature of phase provides a way to achieve various lengths of delay. If the input pulses are periodic, a delay of $\tau_0+P$ is equivalent to a delay of $\tau_0$ after dropping the next input pulse. Likewise, a delay of $\tau_0-P/N$ is equivalent to a delay of $\tau_0+P*(N-1)/N$ of the preceding input pulse.

Consider the case where the rightmost transfer point is active, i.e., the transfer occurs at the last stage, and event_in 32 is a clock pulse. The latency of the tunable delay line 22 is $\tau_0+P*(N-1)/N$. When the control_in signal 34 requests an increase in the delay, the next clock pulse propagates through the slow pipeline 26 without a transfer to the fast pipeline 28, thereby dropping the clock pulse, and the following pulse is transferred to fast pipeline 28 at the first transfer point. The foregoing can be further explained as follows.

Let successive clock events be numbered ($\Phi_1$, $\Phi_2$, $\Phi_3$, ... ). Assume a scenario where the control_in signal 34 requests a delay of $\tau_0+P*(N-1)/N$ for clock pulse $\Phi_{n-1}$ and a delay of $\tau_0+P$ for clock pulse $\Phi_n$. The delay of clock pulse $\Phi_{n-1}$ by $\tau_0+P*(N-1)/N$ is achieved by transferring clock pulse $\Phi_{n-1}$ from the slow pipeline 26 to the fast pipeline 28 at the last stage (i.e., the rightmost transfer point). Clock pulse $\Phi_{n+1}$ occurs P time units after clock pulse $\Phi_n$. Therefore, a delay of clock pulse $\Phi_n$ by $\tau_0+P$ time units produces a pulse at the same time as delaying clock pulse $\Phi_{n+1}$ by $\tau_0$. To effect a delay of $\tau_0+P$ for clock pulse $\Phi_n$, clock pulse $\Phi_n$ is ignored, and clock pulse $\Phi_{n+1}$ is delayed by $\tau_0$. Clock pulse $\Phi_n$ can be ignored by inserting it into the slow pipeline 26 and letting it propagate all the way through the slow pipeline 26, i.e., not transferring it to the fast pipeline 28. It should be understood that a person skilled in the art will recognize that there are other effective mechanisms for ignoring a clock pulse. The foregoing approach is beneficial for particular embodiments of the present invention to be described later.

To delay clock pulse $\Phi_{n+1}$ by $\tau_0$, clock pulse $\Phi_{n+1}$ is transferred to the fast pipeline 28 at the leftmost transfer point as described above. Let $t_0$ be the time at which clock pulse $\Phi_{n-1}$ entered the tunable delay line 22 to go through the rightmost transfer point. This pulse $\Phi_{n-1}$ exits the tunable delay line 22 at time $t_0+\tau_0+P*(N-1)/N$. Clock pulse $\Phi_n$ occurs at time $t_0+P$. This pulse $\Phi_n$ is ignored. Clock pulse $\Phi_{n+1}$ then occurs at time $t_0+2*P$. This pulse $\Phi_{n+1}$ travels through the leftmost transfer point and exits the tunable delay line 22 at time $t_0+2*P+\tau_0$. Thus, the two successive output pulses $\Phi_n$ and $\Phi_{n+1}$ are separated by time $P(1+1/N)$ as should be the case for increasing delay. Note that when the delay steadily increases, the output period is $P(1+1/N)$, whereas the input period is P. Thus, one input pulse of event_in 32 out of N is dropped.

Now, consider the case where the transfer point located to the immediate right of the leftmost transfer point is active. The latency of the tunable delay line 22 is $\tau_0+P/N$. If the control_in signal 34 requests two consecutive decreases in delay, then the output pulses occur respectively with delays of $\tau_0$ and $\tau_0-P/N$. To achieve this, the control_in signal 34 selects both the rightmost and the leftmost transfer points for the next pulse. In response to this pulse, the first stage of the slow pipeline 26 outputs a pulse into the fast pipeline 28 and it also outputs a pulse to the second stage of the slow pipeline 26. The pulse that propagates through the fast pipeline 28 arrives at the final stage first and is output with a delay of $\tau_0$ time units. The pulse that propagates through the slow pipeline 26 is output with a delay of $\tau_0+P*(N-1)/N$. Thus, the output pulses are separated by time $P(1-1/N)$ as should be the case for decreasing delay. When the delay steadily decreases, the output period is $P(1-1/N)$, whereas the input period is P. Thus, one input pulse $\Phi_{in}$ 32 out of N−1 is duplicated.

Three exemplary implementations of a stage of the tunable delay line 22 will now be described. In each of these implementations, it is assumed that the input events event_in are periodic with a period of P time units, for example a clock pulse. Each of these exemplary implementations uses asP*, but one skilled in the art will recognize that other self-timed pipeline techniques could be used as well.

Figure 5:
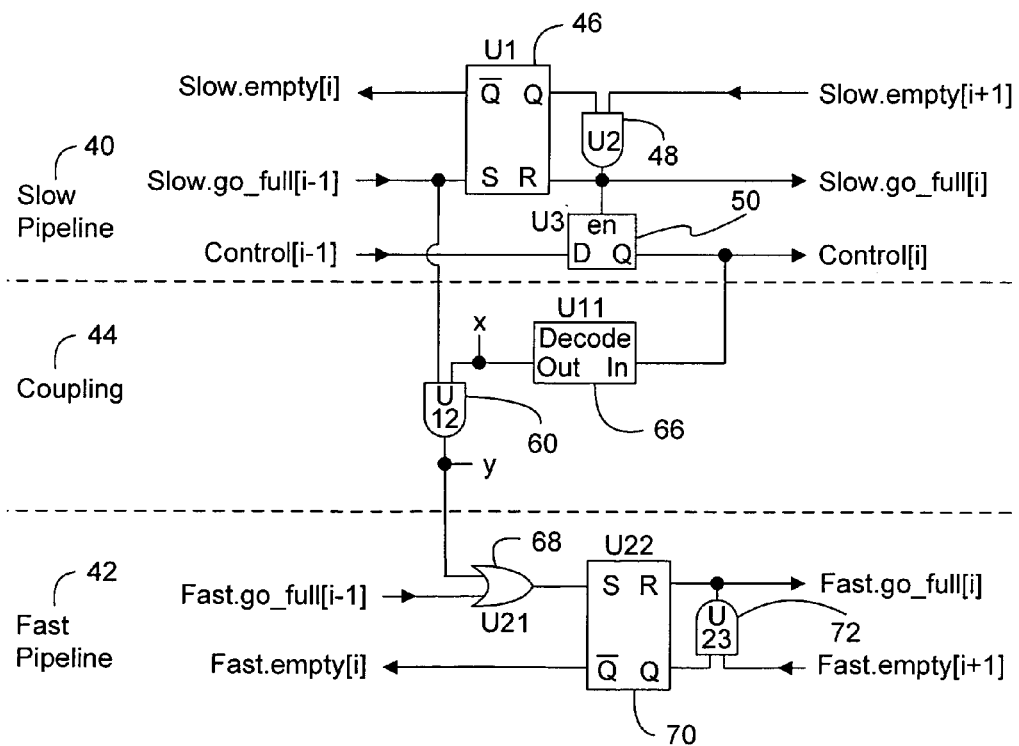
FIG. 5 is a simplified logic diagram showing a first exemplary embodiment of a stage from the tunable delay line from FIG. 4 in accordance with the present invention.

FIG. 5 shows a first exemplary implementation of a stage of the tunable delay line 22 from FIG. 4. In this implementation, the control_in input 34 is used to specify the delay from the kth input event to the kth output event, represented as delay(k). In the implementation of FIG. 5, the control input corresponding to any input event specifies the stage at which the next input event should be coupled to the fast pipeline to achieve the desired delay. In other words, delay (k+1) is input to the pipeline with input pulse k. Any delay can be specified as long as the period between two successive events exceeds the minimum cycle time of a stage of the fast pipeline.

In the exemplary embodiment of FIG. 5, a stage of the tunable delay line 22 includes three components: a slow pipeline stage 40, a fast pipeline stage 42, and a coupling stage 44 which is used to couple the slow pipeline stage 40 to the fast pipeline stage 42. A number of these slow pipeline stages 40 are coupled together to form the slow pipeline 26; likewise, a number of the fast pipeline stages 42 are similarly coupled together to form the fast pipeline 28.

The slow pipeline stage 40 comprises a number of elements including a reset/set logic function, an AND logic function and a signal recorder. In an exemplary embodiment, the reset/set logic function is implemented using an R/S latch 46, the AND logic function is implemented using an AND gate 48, and the signal recorder is implemented using a latch 50. The output Q of the R/S latch 46 and the signal slow.empty[i+1] (which is the complementary output $\overline{Q}$ of a R/S latch from a subsequent stage) are fed into the inputs of the AND gate 48. The output of the AND gate 48 is coupled to three locations, namely, the Reset signal R of the R/S latch 46, the Enable signal (en)of the latch 50, and the Set signal of an R/S latch in the subsequent slow pipeline stage, represented as slow.go_full[i]. The complementary output $\overline{Q}$ represented as slow.empty[i] is coupled to the input of an AND gate in the previous stage. The Set signal (S) of the R/S latch 46, represented as slow.go_full[i−1] is coupled to the Reset signal of the R/S latch in the previous stage. The signal control[i−1] emanating from the output of a corresponding latch in the previous stage is coupled to the input D of the latch 50. Finally, the output Q of the latch 50 is coupled to the input of a corresponding latch in the subsequent stage.

The coupling stage 44 comprises a decoder 66 and an AND gate 60. Decoder 66 is coupled to the output Q of latch 50 in the slow pipeline stage 40. The output of decoder 66 is coupled to an input of AND gate 60 at node x. Signal slow.go_full[i−1] is coupled to the other input of AND gate 60.

The fast pipeline stage 42 comprises an OR logic function, a reset/set logic function and an AND logic function. In an exemplary embodiment, the OR logic function is implemented using an OR gate 68, the reset/set logic function is implemented using an R/S latch 70, and the AND logic function is implemented using an AND gate 72. The output of the AND gate 60 from the coupling stage 44 and the signal fast.go_full[i−1] are coupled to the inputs of the OR gate 68. The output of the OR gate 68 gate in turn is coupled to the Set signal of the R/S latch 70. The output Q of the R/S latch 70 and the signal fast.empty[i+1] are coupled to the inputs of the AND gate 72. The complementary output $\overline{Q}$ of the R/S latch 70 is represented as fast.empty[i] and coupled as an input to an AND logic function of the previous slow pipeline stage. The output of the AND gate 72 is coupled to the Reset signal R of the R/S latch 70 and to the input of an OR logic function of the subsequent fast pipeline stage. This last signal is represented as fast.go_full[i].

A stage of the tunable delay line 22, as shown in FIG. 5, operates as follows. The control_in input 34 corresponding to the kth input pulse identifies the stage at which the (k+1)th input pulse is to be transferred to the fast pipeline. These signals propagate through the slow pipeline 26 concurrently with the input pulse 32. At each stage, latch 50 holds the value of the control that was propagated with the previous pulse. Decoder 66 outputs a high signal if the value of the control matches the address of the current stage. The value goes low when a new control value is loaded into latch 50. When the output of decoder 66 goes high, AND gate 60 propagates the next event on slow.go_full[i−1] to the fast pipeline stage 42 through OR gate 68.

The implementation allows the possibility that the value of the control does not match the address of any pipeline stage. In this case, the event propagating on the slow pipeline 26 is not coupled to the fast pipeline at any stage; consequently, no output event is produced for that pulse, and the pulse is said to be dropped. As described above, the capability to drop pulses can be useful when a delay longer than the clock period is desired.

It should be noted that in this implementation there is a minimum allowable output period. In particular, let $\rho_f$ be the minimum cycle time for a fast pipeline stage 42, i.e., the minimum time for which the stage handshakes correctly and manifests a delay acceptably close to $\tau_0/N$ (where N is the number of pipeline stages). The tunable delay line operates correctly as long as each output period is greater than $\rho_f$.

In addition to the usual asP* requirements which are commonly understood, the following additional timing constraints are assumed for correct operation:

(1) The time from a rising edge of slow.go_full[i−1] to the corresponding rising edge of node x is greater than the maximum width for pulses of slow.go_full.

(2) The time from a rising edge of slow.go_full[i−1] to the corresponding rising edge of node x is less than one period of the input clock, P.

(3) The time from a rising edge of slow.go_full[i−1] to the corresponding falling edge of node x is less than one period of the input clock, P.

(4) The time from a rising edge of slow.go_full[i−1] to the corresponding falling edge of node x is greater than the minimum pulse width required for stages of the fast pipeline.

Constraints (1) and (4) impose lower bounds on the delay from node slow.go_full[i−1] through R/S latch 46, AND gate 48, latch 50, and decoder 66 to node x relative to the time required for operation of the asP* pipeline (i.e. R/S latch 46 and AND gate 48 in this and neighboring stages). These constraints can be satisfied, for example, by adding delay to decoder 66 if needed. Constraints 2 and 3 constrain the delay of the same path from slow.go_full[i−1] to node x relative to the clock period, P. These constraints can be satisfied, for example, by making the clock period large enough—in other words, these constraints can be seen as constraining the maximum clock frequency for the design.

Figure 6:
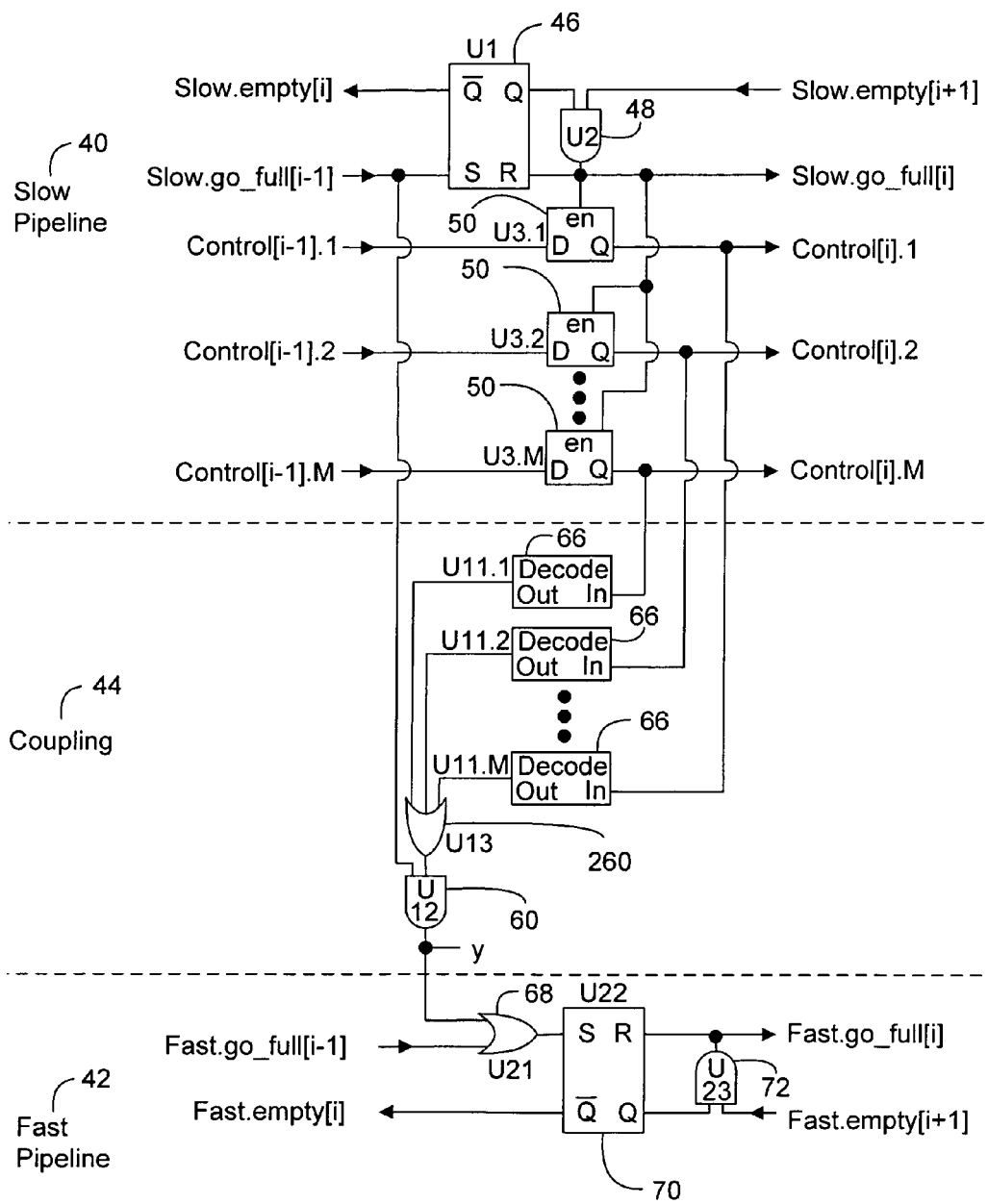
FIG. 6 is a simplified logic diagram showing a second exemplary embodiment of a stage from the tunable delay line from FIG. 4 in accordance with the present invention.

FIG. 6 shows a second exemplary implementation of a stage of the tunable delay line 22 of FIG. 4. In this implementation, the same input event propagating on slow pipeline 26 can be propagated to fast pipeline 28 at each of up to M pipeline stages. The number of output pulses may thus exceed the number of input pulses.

Like the implementation shown in FIG. 5, the implementation shown in FIG. 6 includes a slow pipeline stage 40, a fast pipeline stage 42, and a coupling stage 44. The difference is that the single control signal (control[i−1]) of FIG. 5 has been replaced by M control signals (control[i−1].1, control[i−1].2, . . . , control[i−1].M). As in FIG. 5, each of these control signals represents the address of a stage at which an event is to be propagated to the fast pipeline 28. Also as in FIG. 5, the control signals corresponding to the kth input pulse each identify a stage at which the (k+1)th input pulse is to be propagated to the fast pipeline 28.

Each of the M control signals is coupled to a latch 50 that operates exactly like the latch 50 in the embodiment of FIG. 5. In the coupling stage, there are M decoders 66, with each decoder being coupled to the output of a different one of the latches 50. As is the embodiment of FIG. 5, a decoder 66 produces a high output when the input signal matches the address of the current stage. The outputs of all M decoders 66 are combined by OR gate 260, and the output of OR gate 260 is used as an input to AND gate 60.

The embodiment shown in FIG. 6 operates much like the embodiment of FIG. 5, described above. An event at slow.go_full[i−1] is propagated to fast pipeline stage 42 through OR gate 68 if any one of the M control signals matches the address of the current stage. The event continues to propagate through the slow pipeline as well, so that the same input event can be propagated to the fast pipeline multiple times by specifying different stages in different ones of control signals control[i−1].1, control[i−1].2, . . . , control[i−1].M. This implementation thus supports duplication of pulses. It is also possible that none of the M control signals matches the address of any stage; in that case, a pulse is dropped.

The M control signals can be provided as a segmented control word, with each segment corresponding to a stage at which the event is to be propagated to the fast pipeline 28. For convenience, the control word has the same number of segments for each event; if the number of segments exceeds the number of stages at which the event is to be transferred, then the unused segments are given a NoCouple value, which does not correspond to the address of any segment.

In the implementation of FIG. 6, the desired time between successive output events, period(k) is specified and the M control signals are generated from period(k). For an N-stage pipeline and periodic inputs with period P, this can be done in the following manner:

(1) Define the number of stages of increased or decreased delay required for output event k compared with the previous event: delta(k)=(period(k)−P)*(N/P)

(2) Define cause(k) to be the index of the input event that produces the kth output event, and define couple(k) to be the stage at which the cause(k)th event is coupled to the fast pipeline 28 to produce the kth output event. Define couple (0)=0 and cause(0)=0.

(3) For k>0, it follows that:

$$couple(k)=(couple(k-1)+delta(k)) \bmod N;$$

$$cause(k) = cause(k-1) + 1 + \left\lfloor \frac{couple(k-1) + delta(k)}{N} \right\rfloor$$

(4) From the values of cause(k) and couple(k), the control word can be constructed.

Figure 7:
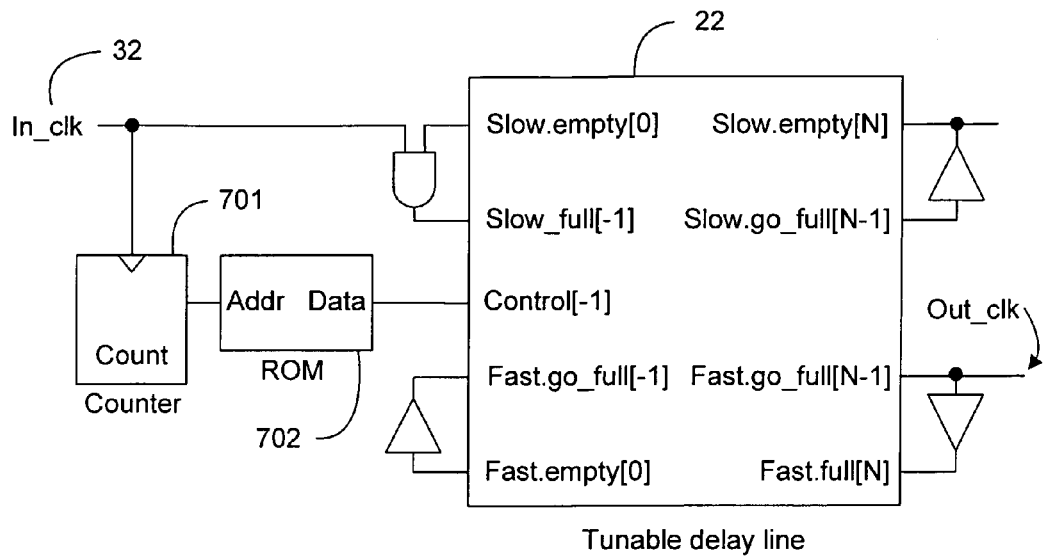
FIG. 7 is an exemplary embodiment for providing control data to a tunable delay line according to the exemplary embodiment of FIG. 6.

A number of implementations for providing a control word from input data period(k) are possible. For example, when the desired period(k) data are known in advance, control data can be calculated in advance and stored in a ROM. As shown in FIG. 7, a counter 701 can be used to select the correct control signal from the ROM 702 as each event 32 enters the tunable delay line 22.

Figure 8:
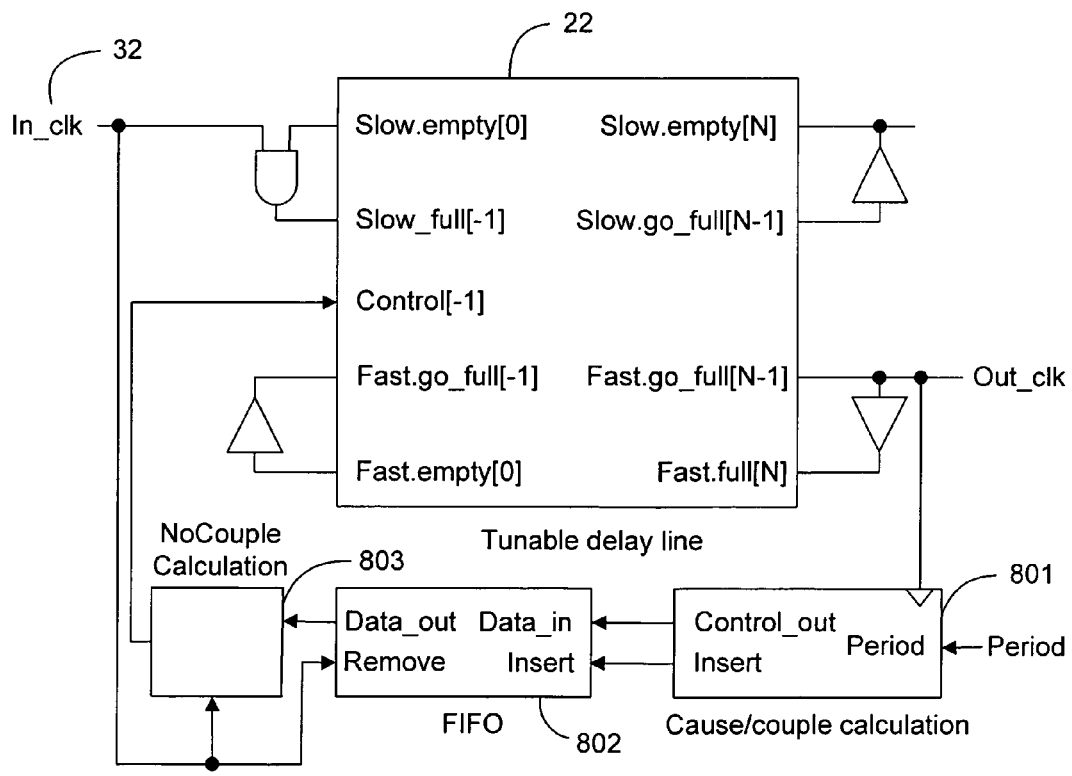
FIG. 8 is an alternative exemplary embodiment for providing control data to a tunable delay line according to the exemplary embodiment of FIG. 6.

Alternatively, as shown in FIG. 8, one output period can be specified per output event. The desired periods are input to cause/couple calculation block 801. Cause/couple block 801 generates a control word (control_out) by grouping period data into control words. Cause/couple block 801 also determines how many (if any) NoCouple control words are needed after each control word and includes the value as a field of the control word. NoCouple control words are needed when a pulse is to be dropped. Control words calculated by cause/couple block 801 are queued in FIFO 802 for further processing. Actual insertion of NoCouple control words is done by NoCouple calculation block 803. On each input clock event 32, NoCouple calculation block 803 outputs either the next control word received from FIFO 802 or a NoCouple control word. The partitioning of functionality between cause/couple block 801 and NoCouple calculation block 803 allows each block to perform a fixed amount of computation per event of its own clock, thereby simplifying hardware implementation. Tables 1 and 2 below show the pseudo-code descriptions of the cause/couple block 801 and NoCouple block 803, respectively.

TABLE 1

Pseudo-code descriptions of the cause/couple block 801.

```
initialization {
    couple = 0; cause = 0;
    pos = 0;
    control.segment = NoCoupleWord;
}
once per output clock event {
    period = nextPeriod( ); // an integer: the desired period * N/P
    oldCouple = couple;
    oldCause = cause;
    // compute new values for delta, cause and couple
    delta = period − N;
    couple = mod(oldCouple + delta, N);
    cause = oldCause + 1 + floor((real)(oldCouple + delta)/(real)(N));
    if (cause > oldCause) {
        control.skip = cause − (oldCause + 1);
```

TABLE 1-continued

Pseudo-code descriptions of the cause/couple block 801.

```
        //input events with no output coupling
        fifo.insert(control); //output the current control buffer
        control.segment = NoCoupleWord; // reset the control buffer
        pos = 0;
    }
    control.segment[pos] = couple;
    pos = pos + 1;
}
```

TABLE 2

Pseudo-code descriptions of the NoCouple block 803.

```
initialization {
    skip = 0;
}
once per input clock event {
    period = nextPeriod( ); // an integer: the desired period *N/P
    oldCouple = couple;
    oldCause = cause;
    if(skip > 0) {
        out = NoCoupleWord;
        skip = skip − 1;
    } else {
        control = FIFO.remove( );
        skip = control.skip;
        out = control.segment;
    }
}
```

In the embodiment of FIG. 6, the number of decoders M determines the maximum number of output events that can be generated from a single input event. In an $$\sum_{j=0}^{m-1} period(k + j) < P$$

embodiment where the input pulses are periodic with period P, M can be determined as follows: Let k, k+1, . . . k+(m−1) be m output events that are generated by the same input event. From the definition of cause(k) given above it follows that:

M is the maximum allowable value of m, which depends on the minimum period between output events. For example, if the minimum output period is at least P, then each input event generates at most one output event (M=1). If the minimum output period is at least P/2, then each input event generates at most two output events (M=2).

One skilled in the art will recognize that in most designs, M will be 1 or 2, making the use of M decoders in each stage (as shown in FIG. 6) a practical and fast implementation. In the case where M is large, a more efficient design is possible. In this design, control word segments are arranged so that the first segment (control.1) specifies a coupling at a stage earlier than the second segment (control.2) and so on. Then each stage requires one decoder to test the value of the first segment (control.1). If it matches, then the decoder propagates the event to the fast pipeline 28 as before; the values of the control segments are shifted so that the value in control.2 moves into control.1, the value in control.3 moves to control.2, and so on. The decoder passes this shifted control word to the next stage. A stage performs the decode and shift operations in the time that it takes an event to forward an event to the next stage. One skilled in the art will recognize that this implementation can be achieved with a single additional gate delay in the data path for each stage.

Figure 9A:
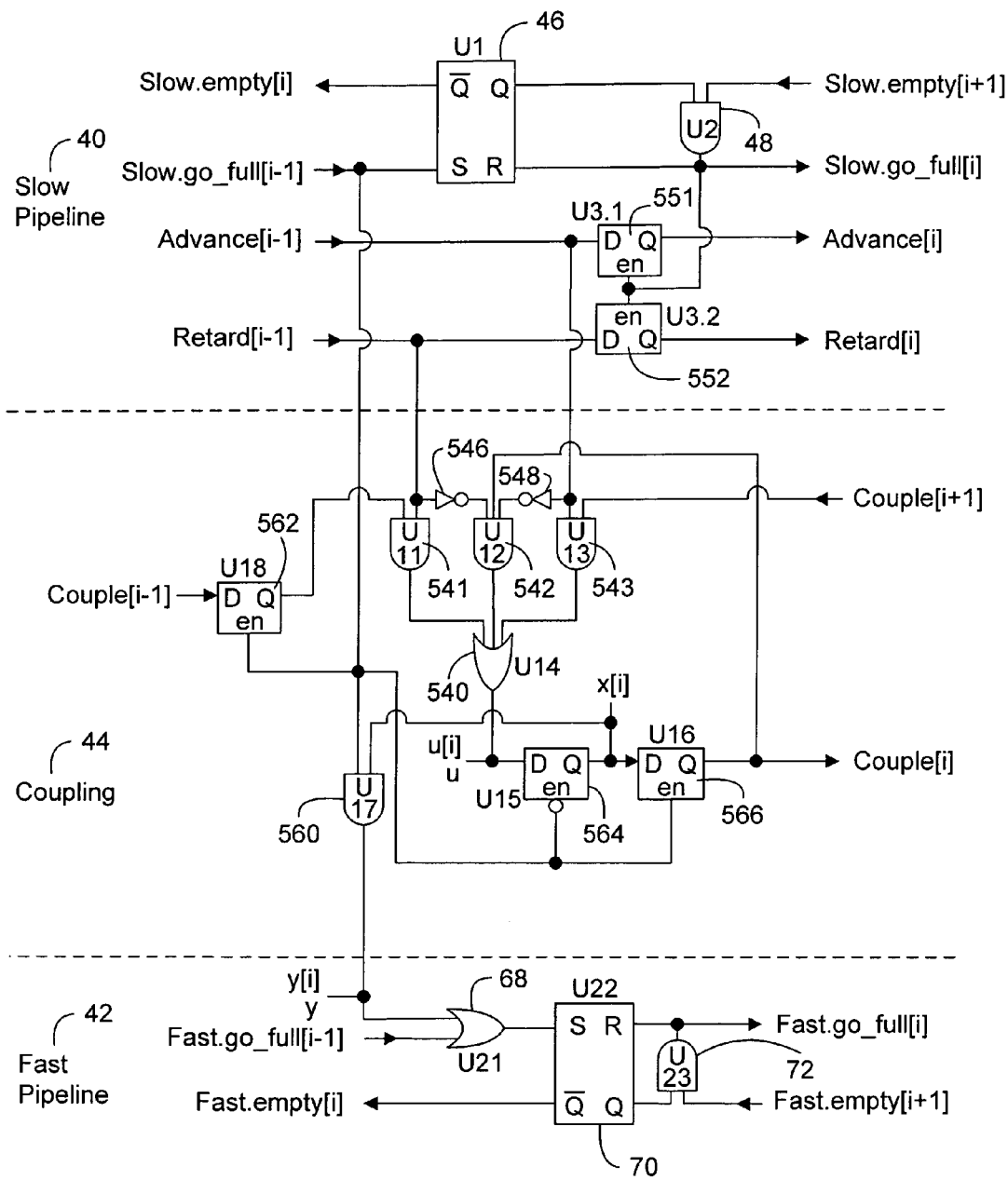
FIG. 9A is a simplified logic diagram showing a third exemplary embodiment of a stage from the tunable delay line from FIG. 4 in accordance with the present invention.

FIG. 9A shows a third exemplary embodiment of a stage of the tunable delay line 22 from FIG. 4. In this embodiment, a tunable delay line stage again comprises a slow pipeline stage 40 coupled to a fast pipeline stage 42 via a coupling stage 44. The slow pipeline stage 40 and fast pipeline stage 42 are configured much like the corresponding stages in the embodiment shown in FIG. 5. But in the embodiment shown in FIG. 9A, the control_input control in comprises two signals: advance, which causes the coupling point to move one stage closer to the input, thereby decreasing the total delay by P/N, and retard, which causes the coupling point to move one stage closer to the output, thereby increasing the total delay by P/N. Thus, the coupling point can move by only one stage per event. This embodiment is useful in applications in which the output period may be P, P+P/N, or P−P,N, such as the EMI reduction technique disclosed in related U.S. patent application Ser. No. 10/306,785, entitled EMI REDUCTION USING TUNABLE DELAY LINES, concurrently filed and commonly assigned.

In the embodiment of FIG. 9A, the propagation of data along the slow and fast pipelines is quite similar to that of previous embodiments. The logic in the coupling stage 44 is different and will now be described in more detail. Coupling stage 44 comprises two-input AND gates 541, 543, 560; three-input AND gate 542; inverters 546, 548; transparent latches 562, 564, 566; and OR gate 540. One input of AND gate 541 is coupled to a couple signal couple[i−1] received from the previous delay line stage via latch 562; the other input of AND gate 541 is coupled to control signal retard [i−1] received from the previous delay line stage. One input of AND gate 542 is coupled to control signal retard[i−1] via inverter 546, a second input of AND gate 542 is coupled to control signal advance[i−1] via inverter 548, and the third input of AND gate 542 is coupled to the output of transparent latch 566. One input of AND gate 543 is coupled to control signal advance[i−1], and the other input of AND gate 543 is coupled to a couple signal couple[i+1] received from the succeeding tunable delay line stage. The outputs of AND gates 541, 542, and 543 are coupled to the inputs of OR gate 540.

The output of OR gate 540 is input D to transparent latch 564. Output Q of transparent latch 564 is provided as input D to transparent latch 566, and to an input of AND gate 560. The other input of AND gate 560 is coupled to data signal slow.go_full[i−1] received from the previous slow pipeline stage, and the output of AND gate 560 is coupled to fast pipeline stage 42 via OR gate 68. The output of transparent latch 566 provides a couple signal couple[i] to the preceding and succeeding delay line stages. Enable signals for transparent latches 562, 564, 566 are provided by data signal slow.go_full[i−1].

The delay line stage functions as follows. When the output of any of AND gates 541, 542, 543 is high, the output of OR gate 540 is high and propagates via latch 564 to AND gate 560 to control the coupling of an event on the slow pipeline 26 to the fast pipeline 28. Three combinations of control signals are possible (in a properly operating embodiment, advance and retard should never both be high for the same event), and the operation under each condition will be described separately.

Figure 9B:
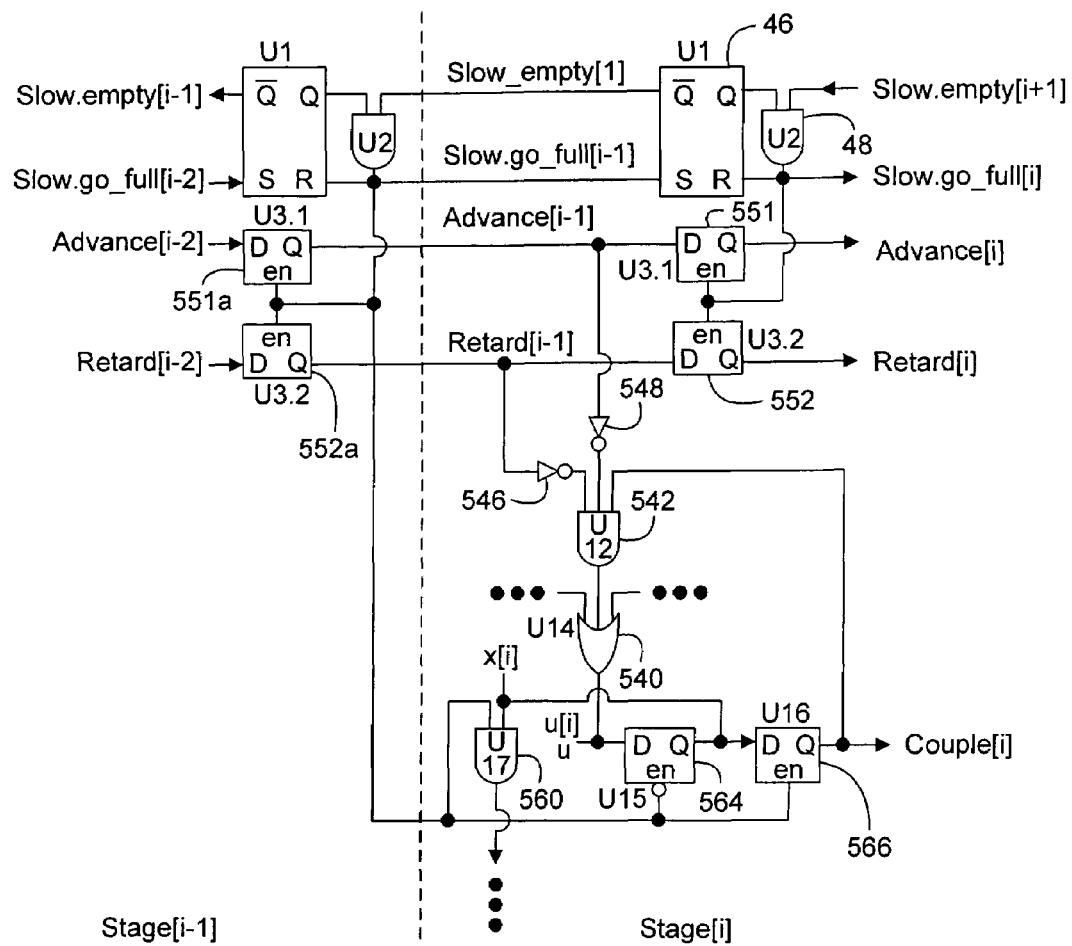
FIGS. 9B–D are simplified logic diagrams showing the operation of the delay line stage of FIG. 9A under different control input conditions.

First, consider the case where neither advance[i−1] nor retard[i−1] is high. In this case, coupling of the current event to the fast pipeline occurs at the same stage as coupling of the previous event. To aid in understanding the operation, the relevant portions of stage i−1 and stage i are shown in FIG. 9B. Latches 564 and 566, along with latches 551 and 552 operate in traditional two-phase clocked style, with signal slow.go_full[i−1] functioning as the clock. The combinational logic network for this condition comprises AND gate 542, inverters 546, 548, and OR gate 540. AND gates 541 and 543 are not shown in FIG. 9B because the output of each of these gates is low in the case where advance[i−1] and retard[i−1] are both low. Inputs to this combinational logic network are driven by latches 551a and 552a in stage i−1 and latch 566 in stage i, all of which are transparent when signal slow.go_full[i−1] is high. The output of the combinational logic network is the input to latch 564, which is transparent when signal slow.go_full[i−1] is low.

For correct operation, the minimum propagation delay of latch 564 is greater than the hold-time requirement of latch 566. One or more buffers can be inserted between these two latches if needed to satisfy this requirement. Likewise, the minimum propagation delay of latches 566, 551, and 552 plus the minimum propagation delay of the combinatorial logic network is greater than the hold-time requirement of latch 564. This requirement is usually easily satisfied, but additional buffers can be added if necessary. Finally, the maximum propagation delay of latches 566, 551, and 552 plus the maximum propagation delay of the combinatorial logic network plus the maximum propagation delay of latch 564 is less than the cycle time of the slow pipeline 26 (i.e., the period of the input clock).

Under these conditions, the delay line stage as shown in FIG. 9A operates as follows. Inverters 546 and 548 deliver high signals to AND gate 542, so that the output of AND gate 542 depends on whether the output of latch 566 is high or low. Now consider the operation at a moment when signal slow.go_full[i−1] is low. If stage i is set to couple the next event on slow.go_full[i−1] to the fast pipeline 28, then the output of latch 564 (i.e., node x[i] in FIG. 9B) is high. When signal slow.go_full[i−1] goes high, it is propagated through AND gate 560 to the fast pipeline 28 (not shown in FIG. 9B). Latch 564 holds the high value of node x[i] and latch 566 propagates the high value to signal couple[i]. Therefore, the output of AND gate 542 goes high, and OR gate 540 produces a high signal at node u[i]. When signal slow.go_full[i−1] subsequently goes low, latches 551a and 552a in stage i−1 continue to hold their values, and the output of latch 566 holds its value; thus node u[i] remains high. The high value propagates-through latch 564; therefore, the next event on slow.go_full[i−1] will be coupled to the fast pipeline as well. Thus, the coupling point remains at the same stage, as desired.

Figure 9C:
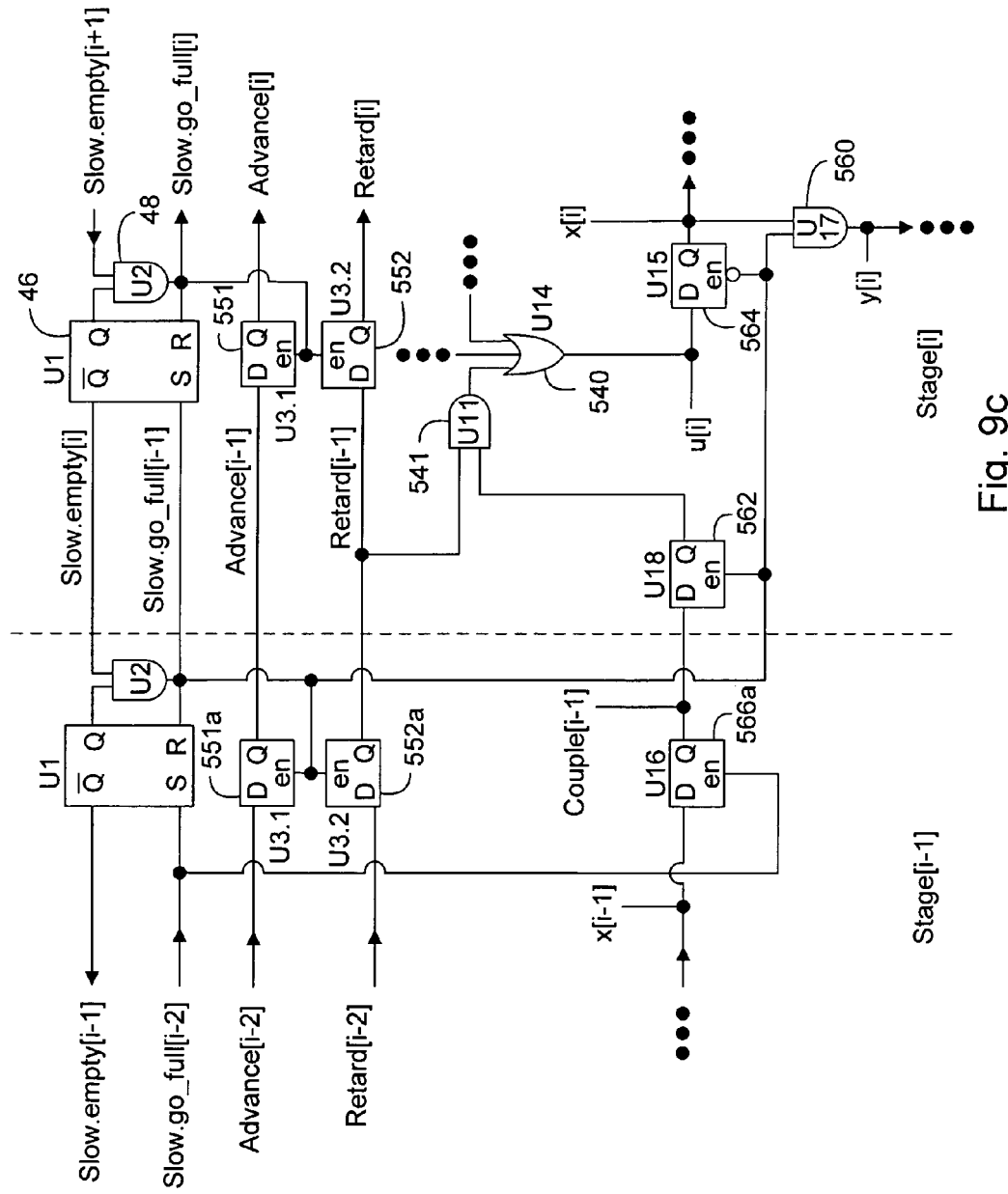

Next, consider the case where signal retard is high for an event k, i.e., conversely, signal advance is low. In this case, the transfer point for the next event (k+1) propagating in the slow pipeline 26 is to be shifted from stage i−1 to stage i. Relevant portions of stage i−1 and stage i for this case are shown in FIG. 9C. AND gates 542 and 543 of FIG. 9A are not depicted in FIG. 9C because their outputs are always low when signal retard is high. The transfer of the value of node x[i−1] from latch 566a of stage i−1 to latch 562 of stage i conforms to standard asP* timing. Latch 552a of stage i−1 and latches 564 and 562 of stage i, and gates 541 and 540 form a two-phase, clocked logic circuit similar to that described for the previous case, and the timing considerations are equivalent.

Consider operation starting at a moment when slow.go_full[i−2] is low and the signal at node x[i−1] is high. When event k arrives at slow.go_full[i−2], it will be coupled to the fast pipeline 28 at stage i−1. When the signal retard is high, the next event k+1 should be coupled to the fast pipeline 28 at stage i. When event k arrives at slow.go_full[i−2], it is coupled to the fast pipeline 28 at stage i−1, by the operations previously described with respect to FIG. 9B. In addition, the rising edge of signal slow.go_full[i−2] enables latch 566a of stage i−1, which drives couple[i−1] high. When event k is propagated to stage i, signal slow.go_full[i−1] goes high, thus enabling latch 562 of stage i to drive its output high, and enabling latch 552 to drive its output high (propagating the retard command). Now, the two inputs of AND-gate 541 are high, and this gate drives its output high, which causes OR-gate 540 to drive node u[i] high. When signal slow.go_full[i−1] goes low, latch 552a of stage i−1 and latch 562 of stage i hold their output values; so, node u[i] remains high. Furthermore, the low value on slow.go_full[i−1] makes latch 564 of stage i transparent, so node x[i] goes high. Thus, stage i is set to couple the next input, event k+1, to the fast pipeline 28.

If signal retard is high for an input event k and stage i−1 is not set to couple event k to the fast pipeline 28, then latch 566a of stage i−1 will drive couple[i−1] low when signal slow.go_full[i−2] goes high, and latch 562 will drive its output low when signal slow.go_full[i−1] goes high. Then, AND gate 541 will drive its output low. OR gate 540 will drive node u[i] low, and the output of latch 564 will go low when slow.go_full[i−1] goes low. Thus, stage i is set to not couple event k+1 to the fast pipeline 28.

Figure 9D:
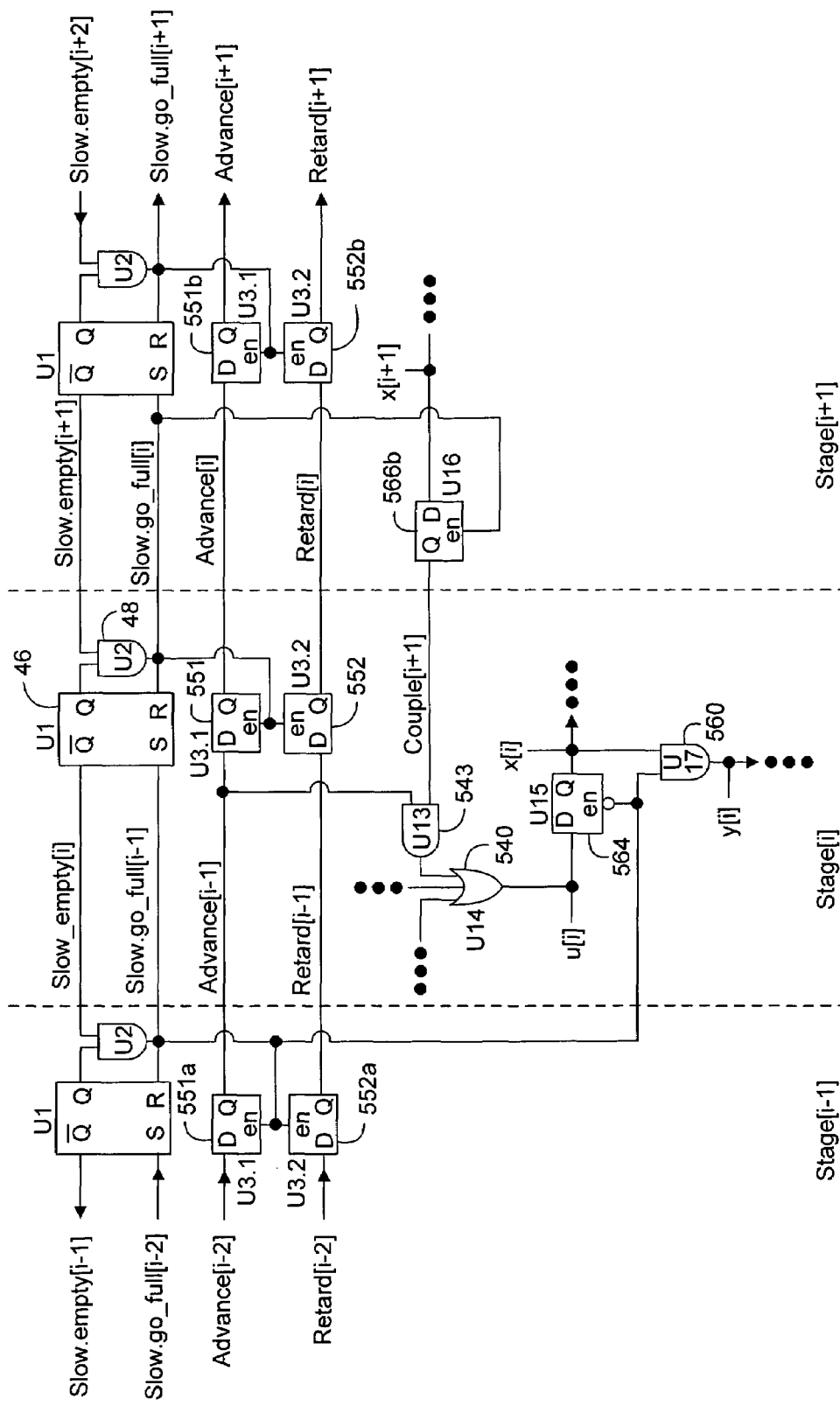

Finally, consider the case where signal advance is high for event k (i.e., signal retard is low). In this case, the transfer point for event k+1 propagating in the slow pipeline 26 is to be shifted from stage i+1 to stage i. Relevant portions of stage i−1, stage i, and stage i+1 for this case are shown in FIG. 9D. AND gates 541 and 542 are not depicted in FIG. 9D because their outputs are always low when signal advance is high.

Consider operation starting from a moment when node x[i+1] is high, indicating that stage i+1 should couple event k to the fast pipeline 28, and signals slow.go_full[i−1] and slow.go_full[i] are both low. When slow.go_full[i−1] goes high, latch 551a of stage i−1 becomes transparent, and advance[i−1] goes high. Concurrently, latch 46 of stage i is set. This leads to slow.go_full[i−1] going low, and latch 551a of stage i−1 now holds a high value on its output. Setting latch 46 of stage i also satisfies one of the conditions for AND gate 48 in stage i to go high. This output may change immediately (if stage i+1 is already empty), or the gate may wait for some amount of time until slow.empty[i+1] goes high. In either case, slow.go_full[i] is low (or about to fall) when slow.go_full[i−1] goes high.

When slow.go_full[i] goes high, latch 566b of stage i+1 becomes transparent, and the high value at node x[i+1] propagates to couple[i+1]. Now, both inputs of AND gate 543 of stage i are high, causing the output of AND gate 543 to go high, which causes OR gate 540 to drive node u[i] high.

Figure 10:
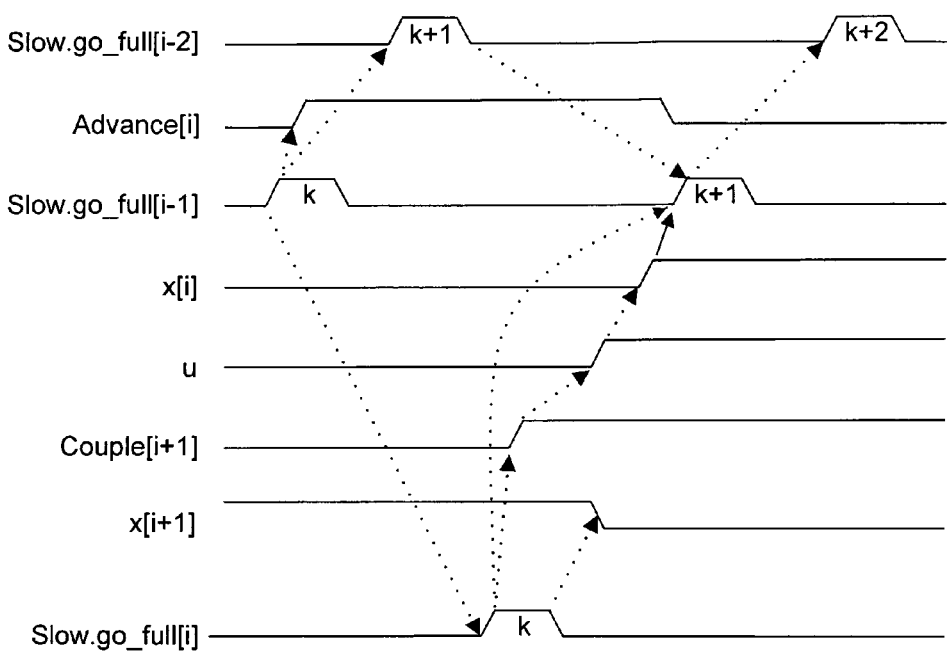
FIG. 10 is a timing diagram for the exemplary embodiment of FIG. 9A, illustrating the timing requirements for advancing a coupling point in a tunable delay line.

For correct operation, node u[i] is driven high long enough before the next rising edge of slow.go_full[i−1] that the output of latch 564 can go high, enabling stage i to couple event k+1 to the fast pipeline 28. More precisely, the total propagation delay of latch 566b of stage i+1 plus the delay of gates 543 and 540 and latch 564 of stage i is less than the reverse latency of a stage of the slow pipeline 26. FIG. 10 illustrates these timing requirements. Each pulse of a slow.go_full signal is labeled with its "event number"—in particular, event k at stage i enables event k at stage i+1 and event k+1 at stage i−1. Dotted arrows in FIG. 10 indicate event orderings that are implied by the logic of the circuit. The solid arrow indicates the ordering that is implied by the timing of the circuit, namely that the rising edge at node x[i] for a high value of advance[i] for event k precedes the rising edge of slow.go_full[i−1] for event k+1.

In the exemplary embodiment shown in FIG. 9A, it is possible that advance or retard signals could cause the coupling point to shift off one of the ends of the slow pipeline 26. For example, if the coupling point is at stage N−1 (the rightmost stage of the tunable delay line shown in FIG. 4) and a retard signal is asserted, this means that the delay line is set to its maximum delay and a period of P+PIN is requested. As described above, this request can be fulfilled by dropping an input event and coupling the next input event to the fast pipeline 28 at stage 0 (the leftmost stage of the tunable delay line shown in FIG. 4).

To set the coupling point to stage 0, one can take advantage of the fact that the control logic applies its inputs directly to stage 0. It is straightforward to provide control logic that keeps track of the location of the coupling point and takes appropriate action as follows: assume that the kth input event is coupled at stage N−1, and the kth control signal is retard. In this case, the (k+1)th input event should propagate through the slow pipeline 26 without coupling to the fast pipeline 28, thereby dropping an event, and the (k+2)th input event should be coupled to the fast pipeline 28 at stage 0.

Figure 11:
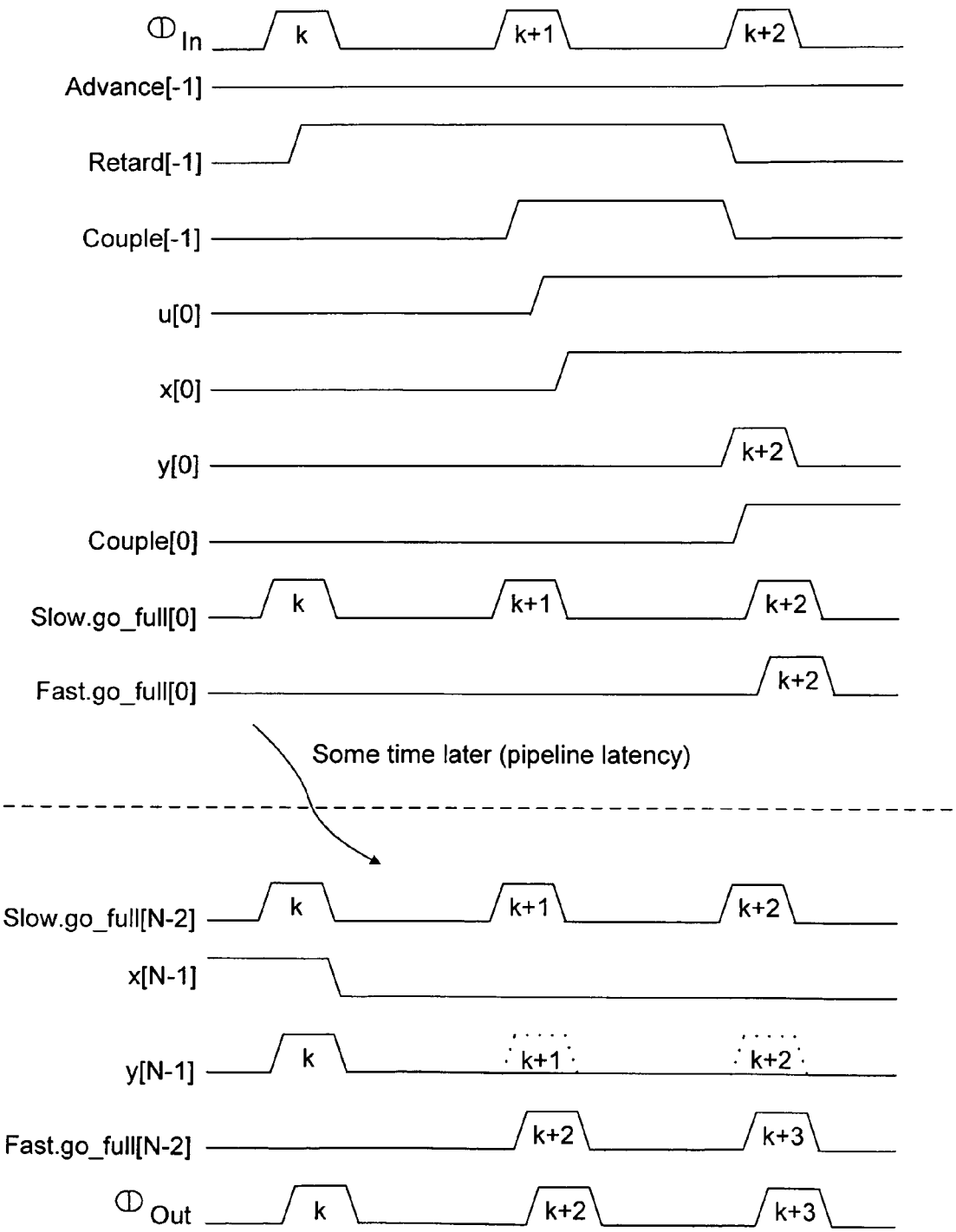
FIG. 11 is a timing diagram for the exemplary embodiment of FIG. 9A, illustrating the pulses produced when the coupling point wraps from the last stage to the first stage of a tunable delay line.

FIG. 11 shows this sequence of events. Pulses on Φ, go_full, and node y are labeled with the input event that caused them. The upper portion of FIG. 11 (above the dotted line) shows events at the input end of the pipeline, and the lower portion shows subsequent events at the output end caused by the events at the input end. As FIG. 11 shows, the following sequence of events occurs.

At the kth input event, the control logic applies a retard command retard[−1]. Stage N−1 couples the event to the fast pipeline 28 and clears its coupling control bits x[N−1] and couple[N−1]. At the (k+1)th input event, the control logic again applies a retard command (retard[−1] remains high). The control logic also asserts the couple[−1] input for stage 0, so that stage 0 functions as if event k had been coupled at an imaginary stage −1. This properly sets the coupling control bits in stage 0. The (k+2)th event is then coupled to the fast pipeline 28 at stage 0. The control logic applies an appropriate command (in FIG. 11, control signal retard goes low so that the coupling remains at stage 0).

On the output side, the dotted pulses on the y[N−1] line indicate the times at which the (k+1)th and (k+2)th input pulses would have been propagated to the last stage of the fast pipeline 28 (i.e., to node y[N−1]) if coupling control signal x[N−1] had been active. The (k+2)th pulse propagating through the fast pipeline 28 arrives at fast.go_full[N−2] PIN time units later than the hypothetical pulse from the (k+1)th event. Thus, the period between the kth output event (generated by the kth input pulse) and the (k+1)th output event (generated by the (k+2)th input pulse) is P+P/N time units.

It is also possible to have a case in which the coupling point is at stage 0 and control signal advance is asserted. This means that the delay line is set to its minimum delay and a period of P−P/N is requested. As described above, the request can be satisfied by propagating one input event to the fast pipeline 28 at both the first and last stages.

In one embodiment, this case could be handled by propagating a third control signal called last through each of the delay line stages. When last is asserted, stage N−1 is set to couple the next event regardless of its state or the state of its neighbors. Thus, if last is asserted with the (k−1)th input event, the kth event is coupled at stage N−1. This embodiment would require adding extra logic to each stage. Alternatively, the logic could be added only to the last stage, but this would make the last stage different from the others, which might create undesirable changes in its timing behavior.

In cases in which the forward latency of the slow pipeline is set to an integer number of clock periods, another embodiment to handle the case of duplicating pulses is possible. This embodiment exploits the known timing relationship between the control circuitry at the input of the delay line and the output of the delay line.

If one assumes that the slow pipeline 26 holds m tokens, then the forward latency of the slow pipeline 26 is m*P. Thus, the rising edge of slow.go_full[N−1] occurs m*P time units after the rising edge of the input event that caused it. Therefore, if the control logic at the input-end of the delay line asserts couple[N] m input events after the (k−1)th input event, this will be picked-up by stage N−1 when the (k−1)th event arrives.

Figure 12:
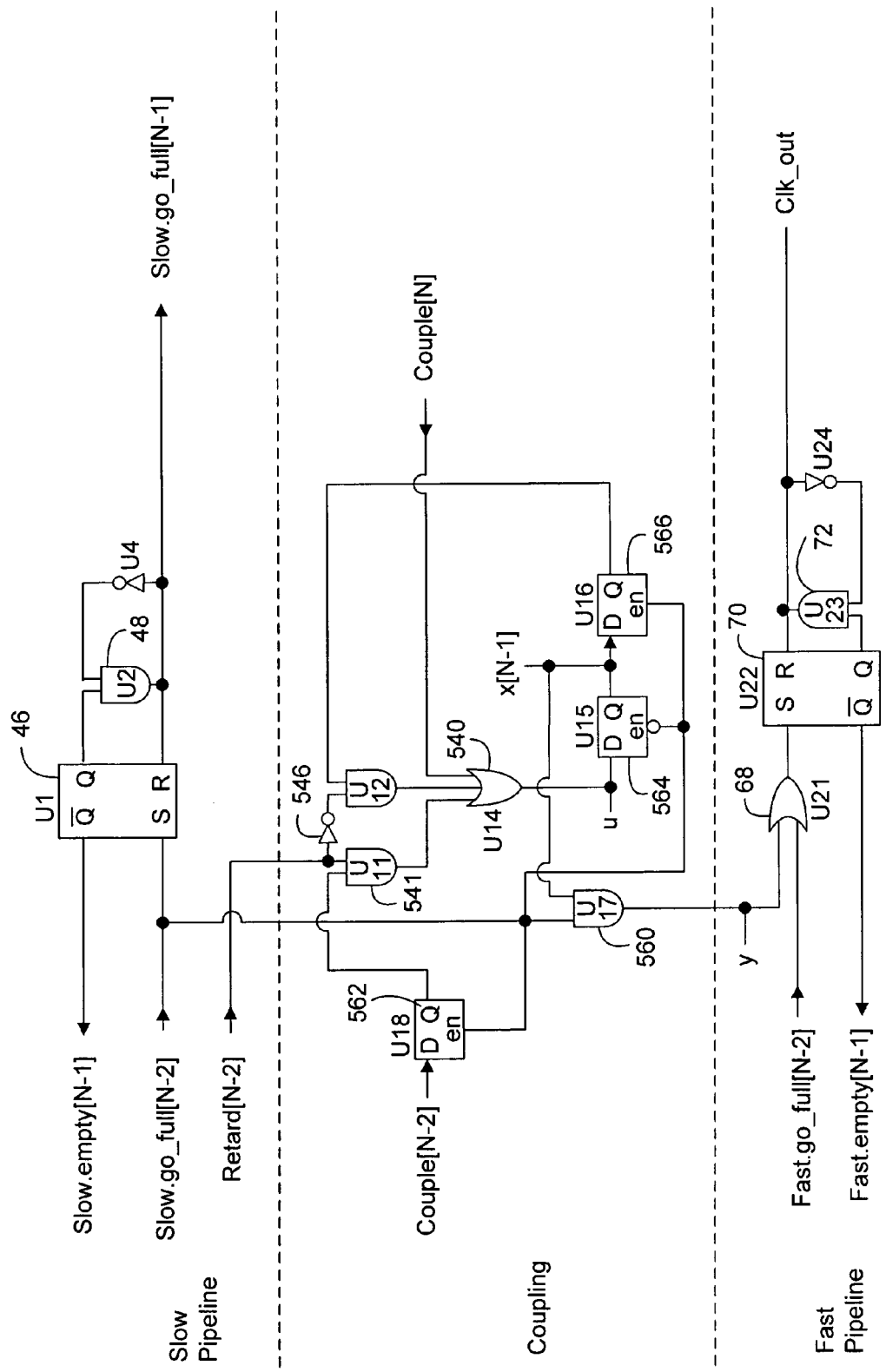
FIG. 12 is an exemplary embodiment of a modified last stage of the tunable delay line of FIG. 9A.

When event k is to be duplicated, input event k−1 sets both stage 0 and stage N−1 to propagate event k. The control input associated with event k−1 establishes the coupling for event k at stage 0, but the coupling at stage N−1 is established separately. FIG. 12 shows a modified stage design for stage N−1 that enables the separate establishment of a coupling. FIG. 12 differs from FIG. 9A in that the advance signal is not coupled to the control logic and AND gate 543 is not present. Thus, whenever couple[N] is asserted, stage N−1 will propagate an event to the fast pipeline 28.

Figure 13:
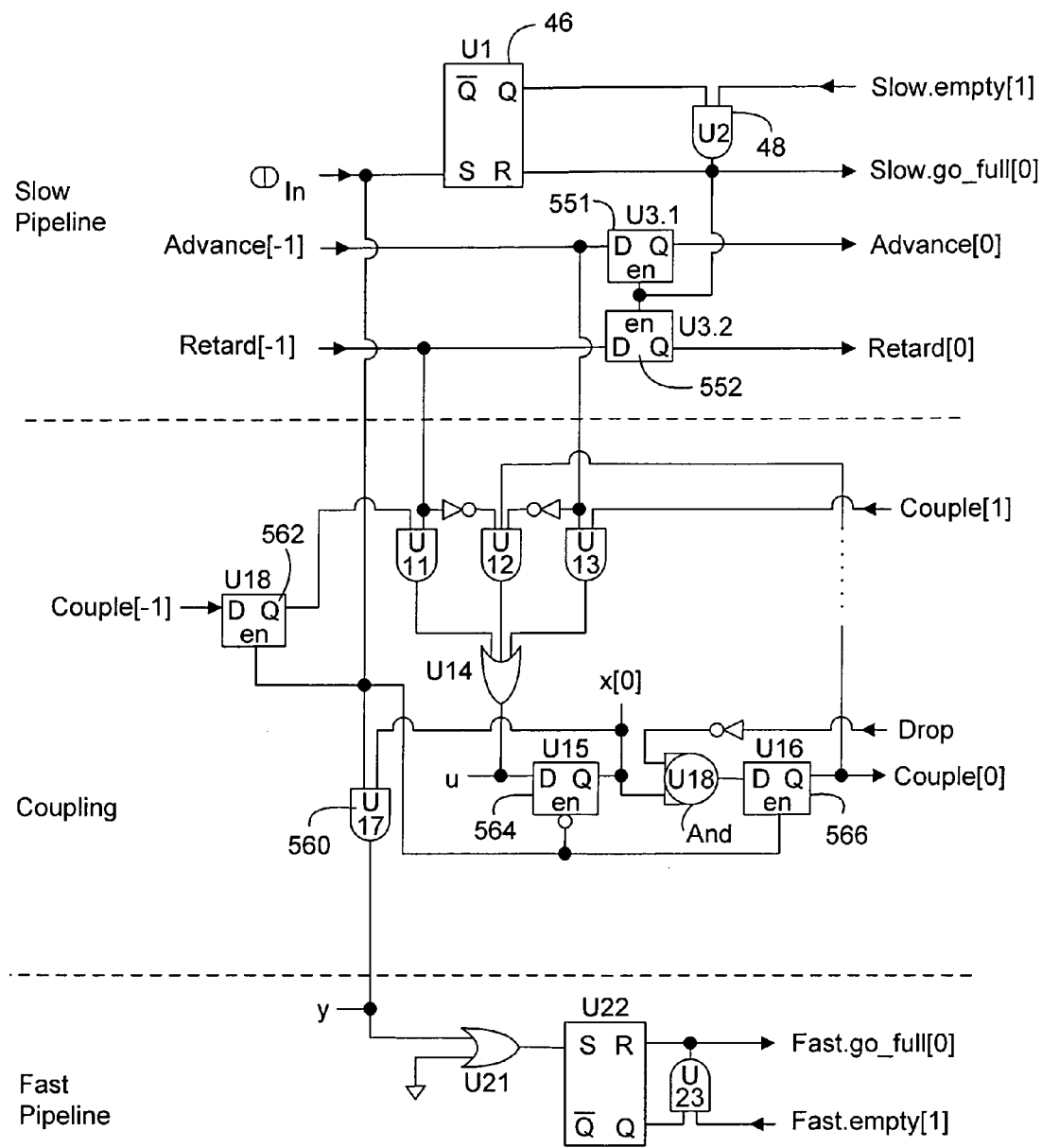
FIG. 13 is an exemplary embodiment of a modified first stage of the tunable delay line of FIG. 9A.

Because it is duplicated, event k establishes two coupling points. The control input associated with event k should apply to stage N−1, and stage 0 should drop its coupling without forwarding it to its neighbor. FIG. 13 shows a modified stage design for stage 0 that enables the dropping of its coupling. FIG. 13 differs from FIG. 9A in the addition of a drop input to the coupling stage. If event k is to be coupled at both stage 0 and stage N−1, then the drop input of stage 0 is asserted on the falling edge of the input event $\Phi_{in}$ after input event k−1. This forces couple[0] low on the rising edge of $\Phi_{in}$ for input event k, which ensures that both node x[0] and couple[0] will be low for the next event.

Figure 14:
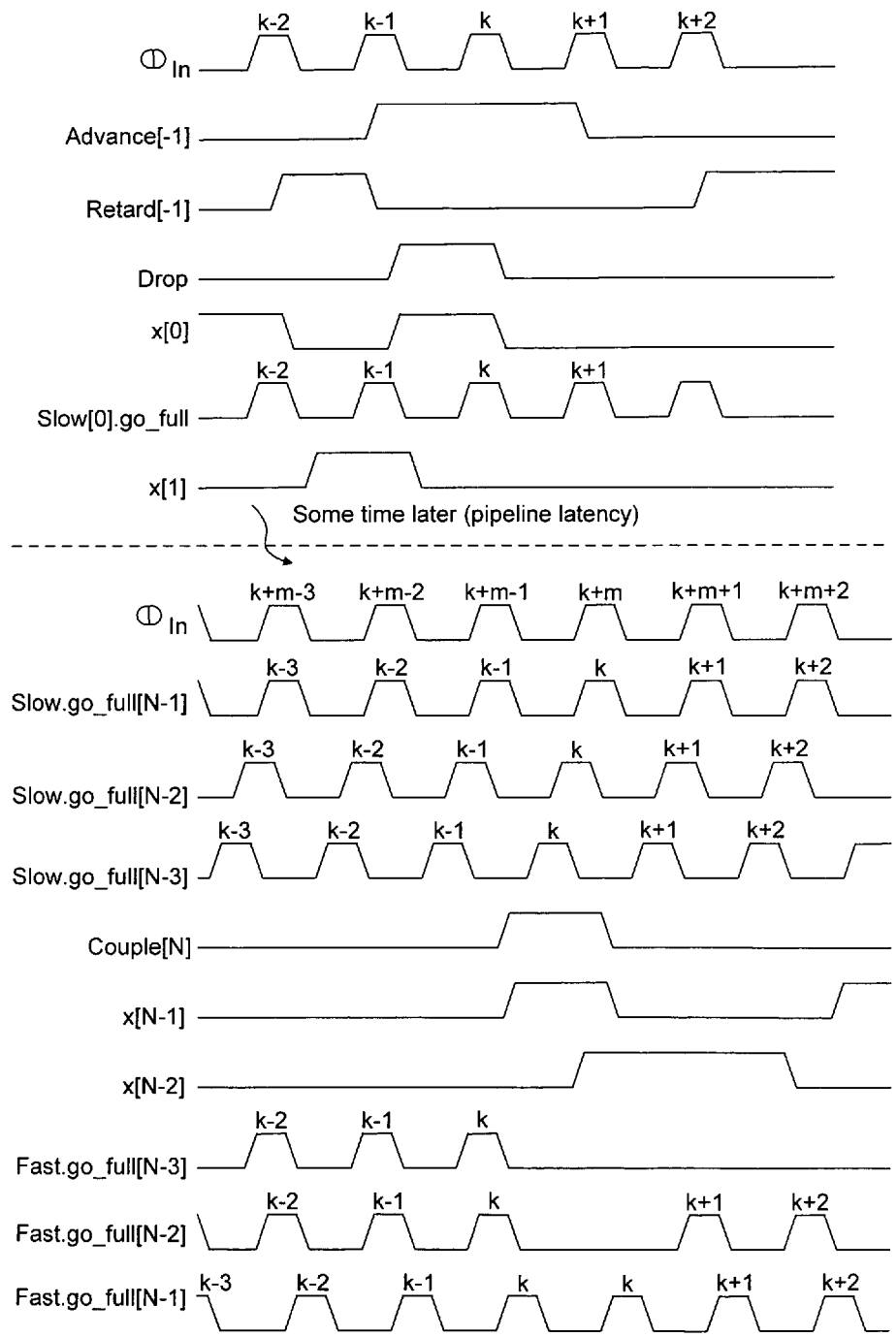
FIG. 14 is a timing diagram for the exemplary embodiment of FIG. 9A, illustrating the pulses produced when the coupling point wraps from the first stage to the last stage of the tunable delay line of FIG. 9A.

FIG. 14 is a timing diagram depicting the operation of the delay line as the coupling wraps from stage 0 to stage N−1. The portion of FIG. 14 above the dotted line depicts input events k−2 through k+2. The portion of FIG. 14 below the dotted line depicts events in the later pipeline stages m cycles later, when events shown in the top portion have propagated through the delay lines. The table below summarizes the operation for the input events:

| input event | coupling stage(s) | command | output period |
| --- | --- | --- | --- |
| k − 2 | 0 | retard | |
| k − 1 | 1 | advance, advance | P + P/N |
| k | 0, N − 1 | advance | P − P/N, P − P/N |
| k + 1 | N − 2 | no move | P − P/N |
| k + 2 | N − 2 | retard | P |
| k + 3 | N − 1 | | P + P/N |

Note that the (k−1)th input event has two control commands associated with it. This is because event k is coupled at two stages and the action for each is specified. The control logic asserts a first advance to move the coupling point from stage 1 to stage 0 by setting advance[−1] high when $\Phi_{in}$ goes high for input event k−1. The coupling at stage N−1 is asserted by setting drop high when $\Phi_{in}$ goes low after input event k−1 and by setting couple[N] high when $\Phi_{in}$ goes high for event k+m−1.

In FIG. 14, the output events are shown as events on fast.go_full[N−1], with each pulse labeled by the input event that caused it. The output events generated from input events k−2 and k−1 and the first output event generated from input event k are coupled to the fast pipeline 28 at early stages and reach the output end via the fast pipeline 28. These are the pulses that appear on fast.go_full[N−3]. The second output event generated from input event k is coupled to the fast pipeline 28 at stage N−1; thus, this output event appears on fast.go_full[N−1] but not in earlier stages of the fast pipeline 28. The output events generated from input events k+1 and k+2 are coupled at stage N−2. These events are seen on fast.go_full[N−2] and fast.go_full[N−1] but not on fast.go_full[N−3].

It should be understood that the preceding are merely examples to illustrate the details of coupling between the two pipelines 26, 28. A personal skilled in the art will know of other ways to implement the present invention.

Figure 15:
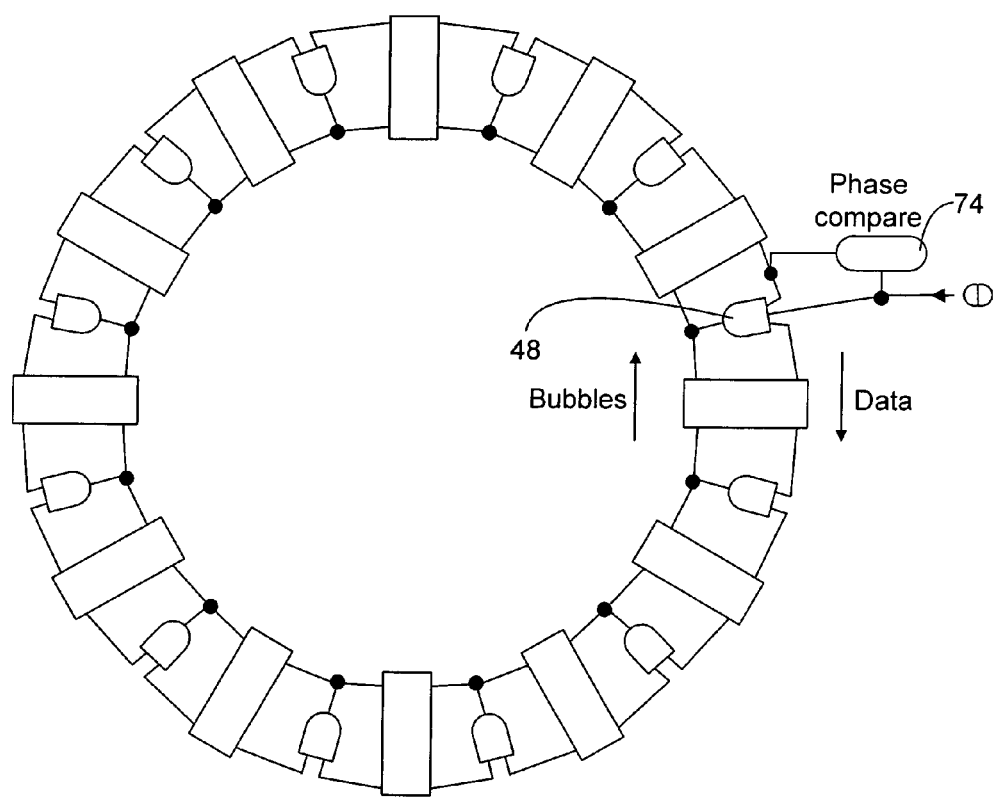
FIG. 15 is a simplified schematic diagram showing one exemplary embodiment of a fast pipeline in accordance with the present invention.

An illustrative example for setting the speed of the slow pipeline 26 will now be described. FIG. 15 is a simplified schematic diagram showing a design for setting the speed of the slow pipeline 26. One stage takes the pulse as input. Conceptually, the propagation of a pulse event along the slow pipeline 26 is analogous to inserting a token into the front of the slow pipeline 26 and removing a token from the end. The foregoing token scheme is implemented by adding a pulse input to the AND gate 48 between the last slow pipeline stage and the first one. This gives the slow pipeline 26 the form of a ring.

If the slow pipeline 26 is initialized with k tokens and the clock period is P, then the forward latency of the slow pipeline 26 will be kP. A phase comparator 74 checks to see whether the token or the clock pulse arrives first at the clock input stage. If the token arrives first, then the per-stage delay is increased. If the clock pulse arrives first, then the per-stage delay is decreased.

With this design, the pipeline delay is a precise, integer multiple of the clock period. Initially, the stage delay is set to its minimum value, and the maximum correction per cycle is small. This ensures that the slow pipeline 26 converges to the desired delay. This, however, requires that kP be within the range of achievable forward latencies of the slow pipeline 26.

An illustrative example for setting the speed of the fast pipeline 28 will now be described. Consider two pipelines with the design from FIG. 15. If the first pipeline is initialized with k tokens and the second with k−1, then the first pipeline will have a forward latency of kP and the second will have a forward latency of (k−1)P, where P is the clock period. Thus, this establishes two pipelines whose forward latencies differ by exactly one clock period.

In an exemplary embodiment using the foregoing approach, two nearly identical pipelines are used to implement the fast pipeline 28. By using two nearly identical pipelines, it can be ensured that interference from pulses injected from the slow pipeline 26 is avoided and that the pulses can propagate all the way around so that the desired (k−1)P delay can be observed. The first is a linear pipeline with coupling points as depicted by FIGS. 4 and 5. The second is a ring. The round trip delay of the ring is set to (k−1)P time units using the techniques described above in connection with the slow pipeline 26 shown in FIG. 15. Then, the control current(s) from the ring is used to control the delays of the stages in the fast pipeline 28. It should be noted that with this approach a mismatch between the two pipelines (the linear pipeline and the ring) might cause a phase jump when wrapping around the fast pipeline 28. When the jump is too large, it is possible to produce an output signal that cannot be used as a system clock. Even if the error is small, this may introduce systematic error for phases near the wrap-around point and leave substantial energy at the nominal clock frequency in the spectrum of the output signal when the delay line is used for electromagnetic interference reduction, as described, for example, in U.S. patent application, Ser. No. 10/306,785, concurrently filed and commonly assigned, entitled "EMI REDUCTION USING TUNABLE DELAY LINES."

Figure 16:
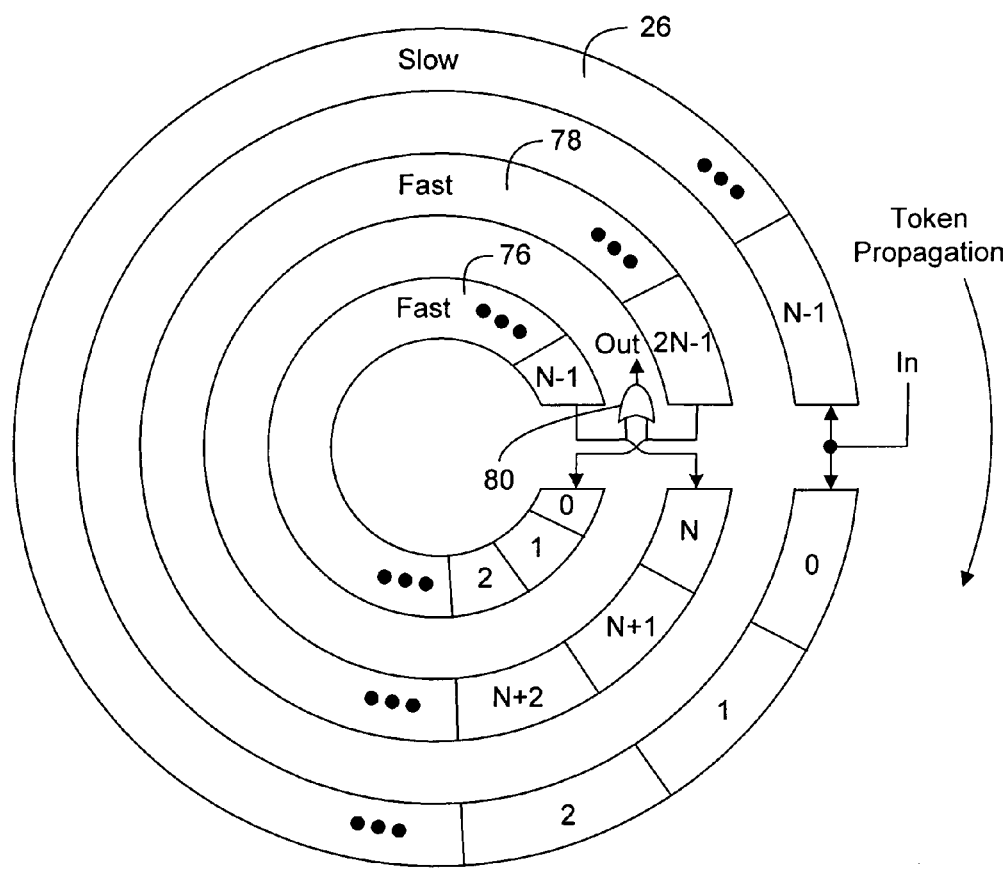
FIG. 16 is a simplified schematic diagram showing another exemplary embodiment of the present invention.

FIG. 16 shows another design for adaptive tuning of delay in the fast pipeline 28 which operates in conjunction with the slow pipeline 26 shown in FIG. 15. The fast pipeline 28 comprises two sub-pipelines and an OR logic function. The first sub-pipeline 76 has N stages ranging from stage 0 to stage N−1 and the second sub-pipeline 78 also has the same number of stages, N, ranging from stage N to stage 2N−1. The last stage of the first sub-pipeline 76, stage N−1, is coupled to the first stage of the second sub-pipeline 78, stage N. Stage N−1 is also coupled to an input of the OR gate 80. Similarly, the last stage of the second sub-pipeline 78, stage 2N−1, is coupled to the first stage of the first sub-pipeline 76, stage 0. Stage 2N−1 is coupled to the input of the OR gate 80. The output of the OR gate 80 generates the output pulse $\Phi_{out}$ 36.

Let:

out($m$)=$N$−1, if $0 \leq m < N$ $2N-1$, if $N \leq m < 2N$ twin($m$)=($m$+$N$) mod $2N$ next($m$)=($m$+1) mod $2N$ slow($m$)=m mod N The fast pipeline 28 has two output stages: stage N−1 and stage 2N−1. Stage out(m) is the first output stage at or following stage m. As described above, the fast pipeline 28 is arranged as two sub-pipelines 76, 78 or "rings" of length N as shown in FIG. 16. If stage m is in one ring, stage twin(m) is the stage in the corresponding position in the other ring. Stage next(m) is the successor of stage m (in the direction of token propagation). Stage slow(m) of the slow pipeline 26 is the stage of the slow pipeline 26 that can inject tokens into stage m of the fast pipeline 28.

Stage m of the slow pipeline 26 has coupling circuitry to stages m and m+N of the fast pipeline 28. Thus, a token can be copied from stage m of the slow pipeline 26 to either stage m or to stage m+N of the fast pipeline 28, but the same token will not be transferred to both. For simplicity, the connections for the coupling circuitry are not shown in FIG. 16. One possible design is the extension of the design with a single slow ring shown in FIG. 5.

When a token is transferred from the slow pipeline 26 into stage m of the fast pipeline 28, (for $0 \leq m < 2N$), the token propagates to stage out(m) and is output. Operation of the rings ensures that tokens cannot arrive concurrently at stages N−1 and 2N−1, erroneous output events are precluded. Furthermore, the token propagates from stage out(m) to stage next(out(m)). From stage next(out(m)) the token propagates to stage twin(m). The propagation from stage m to stage twin(m) within the fast pipeline 28 nominally takes (k+1)P time units.

Now consider the operation of the slow pipeline 26 as shown in FIG. 16. When a token is inserted into stage m of the fast pipeline 28, the fast token continues in the slow pipeline 26 to stage N−1. By the tuning of the slow pipeline 26, this token is available at the output of stage N−1 coincident with the arrival of an external clock event. Thus, the token is transferred to stage 0 of the slow pipeline 26 with the same delay as the other transfers in the slow pipeline 26. This token continues in the slow pipeline 26 and arrives at stage slow(m) kP time units after the arrival of the injecting token. The previous token arrives P time units earlier, which is (k−1)P time units after the arrival of the injecting token. Thus, a token arrives at stage slow(m) of the slow pipeline 26 at the same time as the token that had been injected at stage m should arrive at stage twin(m). These arrival times can be compared, and the forward latency of the fast pipeline stages can be adjusted accordingly.

There are several mechanisms for identifying when a pulse in the fast pipeline 28 has reached the stage at which the phase comparison is to be performed. The target delay of the fast pipeline is (k−1)P. In a first mechanism, the slow pipeline 26 maintains a second set of transfer points for phase comparison in the fast pipeline 28. The control of these transfer points is the control for the original set delayed by k−1 clock cycles. The implementation of the transfer points is the same as that for the fast pipeline 28.

In a second mechanism, the transfer point control signals are forwarded to the fast pipeline 28 along with the pulse from the slow pipeline 26. The fast pipeline 28 then implements a mechanism equivalent to that of the slow pipeline 26 determining the transfer point to determine the phase comparison point.

A third mechanism is based on the observation that a pulse travels N stages in the fast pipeline 28 prior to a phase comparison. A value can be forwarded between the stages of the fast pipeline 28. When a pulse is transferred from the slow pipeline 26, this value is set to zero. Each successive stage increments this value. The stage at which the value of N occurs is the correct stage for the phase comparison.

Based on the disclosure provided herein, other variations of these mechanisms will be apparent to one of ordinary skill in the art.

The stage of the fast pipeline 28 that performs the phase comparison does not propagate the pulse to its successor. The operation of the delay line ensures that this pulse has already generated an output. By dropping the pulse, the stage that performs the phase comparison prevents spurious output events.

This design has several desirable properties. First, no matter how the transfer point moves between injecting a token into stage m and testing it at stage m+1, it cannot overlap the propagating token. This is because the transfer point moves at most one position per clock period. The token propagates forward faster than this. Thus, a forward moving transfer point cannot overtake the token. Furthermore, a backward moving transfer point has to move at least N positions to overtake the token (at stage twin(m)). This is the number of stages that the token propagates through from stage m to stage twin(m). Thus, the token gets there first.

Second, delay calibration only accumulates delay from half of the fast pipeline stages per token tested (i.e. those from stage m to stage twin(m)). Fortunately, these include all stages from stage m to stage out(m). Thus, the part of the fast pipeline 28 that is used for generating output events is calibrated by its own pulse. This means that most stages in the path were calibrated by the preceding pulses. The exception to this rule occurs as the transfer point moves backwards to decrease the total delay from in to out. When the transfer point is moved one stage back, the stage at the new transfer point was not in the path of the previous token, thus, it was not calibrated by the previous pulse, and may not have been calibrated by any recent pulse. Hence, "uncalibrated" stages are added only one at a time, and the matching of the stages makes the error from this very small. Alternatively, some provision may be made to "warm-up" a stage for a few cycles before it is included in the delay path.

The situation in which the transfer point crosses the boundary from stage N−1 to stage N or from stage 2N−1 to stage 0 is discussed below. Only the N−1 to N cases are described as the others are equivalent.

If the transfer point is at stage N−1 and the control requests an increase of delay by P/N, then an input pulse is dropped and the following pulse is transferred at stage N. As described above, the delay for a pulse transferred at stage N is P−P/N less than the delay for a pulse transferred at stage N−1. Dropping a pulse introduces an effective extra delay of P, for a net increase of delay of P/N as required.

If the transfer point is at stage N and the control requests a decrease of delay by P/N, then the last pulse to be transferred at stage N is also transferred at stage N−1. The transfer at stage N−1 produces an output pulse P−P/N after the output produced by the transfer at stage N. This produces an effective decrease of delay of P/N as required.

By duplicating the hardware of the fast pipeline 28, it is possible to increase or decrease the delay by an arbitrary number of steps of size P/N. As with the original design, this is achieved by exploiting the cyclical nature of phase. The delay of the stages of the slow pipeline 26 is set by adaptively adjusting the delay to be exactly k clock periods, where k is the occupancy of the slow pipeline 26. This adaptive delay adjustment is straightforward to implement with an arbiter and a charge pump.

The fast pipeline 28 is also adaptively tuned. It is initialized to hold 2(k−1) tokens, and the delay of a N stage segment is adjusted to be (k−1)P time units. The adjustment circuitry is similar to that of the slow pipeline 26. However, the time-of-arrival comparison for the slow pipeline 26 is only required at the stage where the external clock signal is input. For the fast pipeline 28, this comparison can be performed at any stage.

Although the above embodiments are implemented using asP*, other self-timed pipelining techniques could be used including Muller-C pipelines and micropipelines. A person skilled in the art will understand how other self-timed pipeline techniques could be used to implement the present invention described herein.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A circuit for controlling signal propagation, comprising:
    a first signal-propagating pipeline having a first adjustable forward latency;
    a second signal-propagating pipeline having a second adjustable forward latency; and
    a plurality of transfer points from a first plurality of points along the first signal-propagating pipeline to a second plurality of points along the second signal-propagating pipeline for allowing a signal propagating along the first signal-propagating pipeline to be transferred to the second signal-propagating pipeline via one of the plurality of transfer points;
    wherein the first adjustable forward latency is longer than the second adjustable forward latency.

2. The circuit according to claim 1, wherein the first adjustable forward latency is one clock period longer than the second adjustable forward latency.

3. The circuit according to claim 1, wherein a signal entering the first signal-propagating pipeline is transferred to the second signal-propagating pipeline via one of the plurality of transfer points so as to generate a delayed version of the signal entering the first signal-propagating pipeline.

4. The circuit according to claim 3, wherein the signal entering the first signal-propagating pipeline is a clock signal; and
    wherein generating the delayed version of the signal entering the first signal-propagating pipeline causes electromagnetic interference generated by the clock signal to be reduced.

5. The circuit according to claim 1, wherein the first and second signal-propagating pipelines both operate in a first-in-first-out manner.

6. The circuit according to claim 1, wherein the first signal-propagating pipeline comprises a first plurality of identical stages; and
    wherein the second signal-propagating pipeline comprises a second plurality of identical stages.

7. The circuit of claim 1, wherein a first transfer point in the plurality of transfer points is from a first point along the along the first signal-propagating pipeline to a second point along the second signal-propagating pipeline and a second point in the plurality of transfer points is from a third point along the along the first signal-propagating pipeline to a fourth point along the second signal-propagating pipeline.

8. A signal propagation control circuit, comprising:
    a first plurality of propagation stages sequentially coupled to one another, the first plurality of propagation stages collectively having a first adjustable forward latency;
    a second plurality of propagation stages sequentially coupled to one another, the second plurality of propagation stages collectively having a second adjustable forward latency; and
    a plurality of coupling stages for coupling the first plurality of propagation stages to the second plurality of propagation stages;
    wherein each stage of the first plurality of propagation stages is coupled to a corresponding stage of the second plurality of propagation stages via a corresponding coupling stage, wherein a first stage of the first plurality of propagation stages is coupled to a corresponding first stage of the second plurality of propagation stages and a second stage of the first plurality of propagation stages is coupled to a corresponding second stage of the second plurality of propagation stages;
    wherein a signal propagating along the first plurality of propagation stages is capable of being transferred to the second plurality of propagation stages via one of the plurality of coupling stages in response to a control signal, thereby allowing the signal to propagate along the second plurality of propagation stages; and
    wherein the first adjustable forward latency is longer than the second adjustable forward latency.

9. The circuit according to claim 8, wherein each stage of the first plurality of propagation stages includes:

a first R/S logic function having an input and an output;
a signal recorder having an enable input, a data input and an output; and
a first AND logic function having an input coupled to the output of the first R/S logic function and an output coupled to the input of the first R/S logic function and the enable input of the signal recorder.

10. The circuit according to claim 9, wherein the signal recorder comprises a pair of latches.

11. The circuit according to claim 9, wherein the corresponding coupling stage comprises:
a decoder having an output and an input coupled to the output of the signal recorder; and
a second AND logic function having a first input coupled to the output of the decoder, a second input coupled to the signal propagating along the first plurality of propagation stages, and an output coupled to the second plurality of propagation stages.

12. The circuit according to claim 11, wherein the corresponding stage of the second plurality of propagation stages includes:
a second R/S logic function having a first input, a second input and an output;
an OR logic function having an output coupled to the first input of the second R/S logic function; and
a third AND logic function having an input coupled to the output of the second R/S logic function and an output coupled to the second input of the second R/S logic function; and
wherein the output of the second AND logic function is coupled to an input of the OR logic function.

13. The circuit according to claim 8 wherein the control signal comprises an identifier of a particular coupling stage at which a signal is to be transferred from the first plurality of propagation stages to the second plurality of propagation stages.

14. The circuit according to claim 8 wherein each stage of the first plurality of propagation stages includes:
a first R/S logic function having an input and an output;
a plurality of signal recorders, each signal recorder having an enable input, a data input and an output; and
a first AND logic function having an input coupled to the output of the first R/S logic function and an output coupled to the input of the first R/S logic function and the respective enable inputs of the plurality of signal recorders.

15. The circuit according to claim 14, wherein the corresponding coupling stage comprises:
a plurality of decoders, each decoder having an output and an input coupled to the output of a corresponding signal recorder;
an OR logic function having an output and a plurality of inputs respectively coupled to the outputs of the plurality of decoders; and
an AND logic function having a first input coupled to the output of the OR logic function, a second input coupled to the signal propagating along the first plurality of propagation stages, and an output coupled to the second plurality of propagation stages.

16. The circuit according to claim 15, wherein the control signal comprises a plurality of control words, each control word identifying a particular coupling stage at which a signal is to be transferred from the first plurality of propagation stages to the second plurality of propagation stages.

17. The circuit according to claim 16, wherein the corresponding coupling stage includes:

a first data latch having an output and an enable input coupled to the signal propagating along the first plurality of propagation stages;
a first AND logic function having a first input coupled to the output of the first data latch, a second input coupled to the retard signal, and an output;
a second AND logic function having a first input coupled to an inversion of the advance signal, a second input coupled to an inversion of the retard signal, a third input, and an output;
a third AND logic function having a first input coupled to the advance signal, and an output;
an OR logic function having three inputs coupled respectively to the outputs of the first AND logic function, the second AND logic function, and the third AND logic function, and an output;
a second data latch having an output, an enable input, and a data input coupled to the output of the OR logic function;
a third data latch having an enable input and a data input coupled to the output of the second data latch; and
a fourth AND gate having a first input coupled to the output of the second data latch, a second input coupled to the signal propagating along the first plurality of propagation stages, and an output coupled to the second plurality of propagation stages;
wherein the enable input of the first data latch is coupled to the respective enable inputs of the second and third data latches.

18. The circuit according to claim 14, wherein the control signal comprises an advance signal and a retard signal;
wherein the advance signal and the retard signal are received by the plurality of signal recorders; and
wherein the plurality of coupling stages are configured such that:
when neither the advance signal nor the retard signal is asserted, transfer of the signal from the first plurality of propagation stages to the second plurality of propagation stages occurs at a selected coupling stage;
when the advance signal is asserted, transfer of the signal from the first plurality of propagation stages to the second plurality of propagation stages begins to occur at a coupling stage preceding the selected coupling stage and ceases to occur at the selected coupling stage, so that for subsequent signals propagating along the first plurality of propagation stages, the coupling stage preceding the selected coupling stage becomes the selected coupling stage; and
when the retard signal is asserted, transfer of the signal from the first plurality of propagation stages to the second plurality of propagation stages begins to occur at a coupling stage following the selected coupling stage and ceases to occur at the selected stage, so that for subsequent signals propagating along the first plurality of propagation stages, the coupling stage following the selected coupling stage becomes the selected coupling stage.

19. A tunable delay line, comprising:
a slow signal-propagating circuit;
a fast signal-propagating circuit; and
a coupling circuit for allowing a signal propagating along the slow signal-propagating circuit to be transferred to the fast signal-propagating circuit, wherein the coupling circuit allows the signal to be transferred from a first plurality of points along the slow signal-propagating circuit to a second plurality of points along the fast signal-propagating circuit;

wherein forward latency of the slow signal-propagating circuit is greater than forward latency of the fast signal-propagating circuit.

20. The tunable delay line according to claim 19, wherein the slow signal-propagating circuit further includes a first plurality of sequentially coupled stages;
 wherein the first stage of the first plurality of stages is coupled to the last stage of the first plurality of stages;
 wherein the fast signal-propagating circuit further includes a second plurality of sequentially coupled stages and a third plurality of sequentially coupled stages;
 wherein the first stage of the second plurality of stages is coupled to the last stage of the third plurality of stages;
 wherein the first stage of the third plurality of stages is coupled to the last stage of the second plurality of stages; and
 wherein the first stage of the second plurality of stages and the first stage of the third plurality of stages are coupled to an OR logic function.

21. The tunable delay line according to claim 20, wherein a phase comparator is coupled between the first and last stages of the first plurality of stages.

22. The tunable delay line according to claim 21 wherein the phase comparator is used to adjust the forward latency of the fast signal-propagation circuit.

23. The tunable delay line according to claim 20 wherein the fast signal-propagating circuit has twice the number of stages as the slow signal-propagating circuit.

24. The circuit of claim 19, wherein a first transfer point in the plurality of transfer points is from a first point along the along the first signal-propagating pipeline to a second point along the second signal-propagating pipeline and a second transfer point in the plurality of transfer points is from a third point along the along the first signal-propagating pipeline to a fourth point along the second signal-propagating pipeline.

* * * * *